(12) United States Patent
Radza et al.

(10) Patent No.: US 7,597,561 B2
(45) Date of Patent: Oct. 6, 2009

(54) METHOD AND SYSTEM FOR BATCH FORMING SPRING ELEMENTS IN THREE DIMENSIONS

(75) Inventors: Eric M. Radza, Santa Clara, CA (US); John D. Williams, Campbell, CA (US)

(73) Assignee: Neoconix, Inc., Sunnyvale, CA (US)

( * ) Notice: Subject to any disclaimer, the term of this patent is extended or adjusted under 35 U.S.C. 154(b) by 0 days.

(21) Appl. No.: 11/083,031

(22) Filed: Mar. 18, 2005

(65) Prior Publication Data

US 2005/0164527 A1    Jul. 28, 2005

Related U.S. Application Data

(63) Continuation-in-part of application No. 10/412,729, filed on Apr. 11, 2003, now Pat. No. 7,056,131.

(60) Provisional application No. 60/554,816, filed on Mar. 19, 2004.

(51) Int. Cl.
*H01R 12/00* (2006.01)
(52) U.S. Cl. ........................................... 439/66
(58) Field of Classification Search ................ 439/66, 439/67, 70–71; 324/754, 765, 755, 757–758, 324/761–762; 361/760, 767–768, 771, 777, 361/779; 438/14, 17
See application file for complete search history.

(56) References Cited

U.S. PATENT DOCUMENTS

| | | |
|---|---|---|
| 1,668,011 A | 5/1928 | Friedmann |
| 3,543,587 A | 12/1970 | Kawada |
| 3,634,807 A | 1/1972 | Grobe et al. |
| 3,670,409 A | 6/1972 | Reimer |
| 3,850,500 A | 11/1974 | Cobaugh et al. |
| 4,087,146 A | 5/1978 | Hudson, Jr. |
| 4,175,810 A | 11/1979 | Holt et al. |
| 4,548,451 A | 10/1985 | Benarr et al. |
| 4,592,617 A | 6/1986 | Seidler |
| 4,657,336 A | 4/1987 | Johnson et al. |
| 4,734,053 A | 3/1988 | Imai |
| 4,790,777 A | 12/1988 | Iimori et al. |
| 4,893,172 A | 1/1990 | Matsumoto et al. |
| 4,998,885 A | 3/1991 | Beaman |
| 5,053,083 A | 10/1991 | Sinton |

(Continued)

FOREIGN PATENT DOCUMENTS

EP        1 005 086        5/2000

(Continued)

OTHER PUBLICATIONS

International Search Report and Written Opinion dated Oct. 18, 2005.

(Continued)

*Primary Examiner*—Jean F Duverne

(57) ABSTRACT

A system for batch forming a sheet of spring elements in three dimensions includes a top spacer layer. A plurality of ball bearings is arranged in a predetermined pattern on the top spacer layer. A spring element sheet containing the spring elements defined in two dimensions is positioned on the top spacer layer and the plurality of ball bearings. A top spacer layer is positioned on the spring element sheet. The top spacer layer and the bottom support layer are adapted to have a force applied thereto to push the plurality of ball bearings against the spring element sheet, such that the spring elements extend above the plane of the spring element sheet, thereby forming the spring elements in three dimensions.

10 Claims, 29 Drawing Sheets

U.S. PATENT DOCUMENTS

| | | |
|---|---|---|
| 5,135,403 A | 8/1992 | Rinaldi |
| 5,148,266 A | 9/1992 | Khandros et al. |
| 5,152,695 A | 10/1992 | Grabbe et al. |
| 5,161,983 A | 11/1992 | Ohno et al. |
| 5,173,055 A | 12/1992 | Grabbe |
| 5,199,879 A | 4/1993 | Kohn et al. |
| 5,228,861 A | 7/1993 | Grabbe |
| 5,257,950 A | 11/1993 | Lenker et al. |
| 5,292,558 A | 3/1994 | Heller et al. |
| 5,299,939 A | 4/1994 | Walker et al. |
| 5,316,496 A | 5/1994 | Imai |
| 5,338,209 A | 8/1994 | Brooks et al. |
| 5,358,411 A | 10/1994 | Mroczkowski et al. |
| 5,366,380 A | 11/1994 | Reymond |
| 5,380,210 A | 1/1995 | Grabbe et al. |
| 5,409,200 A | 4/1995 | Zingher et al. |
| 5,423,687 A | 6/1995 | Laub |
| 5,468,655 A | 11/1995 | Greer |
| 5,483,741 A | 1/1996 | Akram et al. |
| 5,509,814 A | 4/1996 | Mosquera |
| 5,528,456 A | 6/1996 | Takahashi |
| 5,530,288 A | 6/1996 | Stone |
| 5,532,612 A | 7/1996 | Liang |
| 5,562,487 A | 10/1996 | Ii et al. |
| 5,575,662 A | 11/1996 | Yamamoto et al. |
| 5,590,460 A | 1/1997 | DiStefano et al. |
| 5,593,903 A | 1/1997 | Beckenbaugh et al. |
| 5,629,837 A | 5/1997 | Barabi et al. |
| 5,632,631 A | 5/1997 | Fjelstad et al. |
| 5,634,821 A | 6/1997 | Crane |
| 5,691,913 A | 11/1997 | Tsuchida et al. |
| 5,751,556 A | 5/1998 | Butler et al. |
| 5,772,451 A | 6/1998 | Dozier, II et al. |
| 5,791,911 A | 8/1998 | Fasano et al. |
| 5,802,699 A | 9/1998 | Fjelstad et al. |
| 5,812,378 A | 9/1998 | Fjelstad et al. |
| 5,842,273 A | 12/1998 | Schar |
| 5,860,585 A | 1/1999 | Rutledge et al. |
| 5,896,038 A | 4/1999 | Budnaitis et al. |
| 5,903,059 A | 5/1999 | Bertin et al. |
| 5,906,498 A | 5/1999 | Nagafuji |
| 5,911,597 A | 6/1999 | Oshitani |
| 5,934,914 A | 8/1999 | Fjelstad et al. |
| 5,938,453 A | 8/1999 | Ichimura |
| 5,956,575 A | 9/1999 | Bertin et al. |
| 5,967,797 A | 10/1999 | Maldonado |
| 5,967,850 A | 10/1999 | Crane |
| 5,980,335 A | 11/1999 | Barbieri et al. |
| 5,981,870 A | 11/1999 | Barcley et al. |
| 5,984,704 A | 11/1999 | Hashiguchi |
| 5,989,994 A | 11/1999 | Khoury et al. |
| 5,993,247 A | 11/1999 | Kidd |
| 6,000,280 A | 12/1999 | Miller et al. |
| 6,019,611 A | 2/2000 | McHugh et al. |
| 6,027,366 A | 2/2000 | Mori et al. |
| 6,029,344 A | 2/2000 | Khandros et al. |
| 6,031,282 A | 2/2000 | Jones et al. |
| 6,032,356 A | 3/2000 | Eldridge et al. |
| 6,042,387 A | 3/2000 | Jonaidi |
| 6,044,548 A | 4/2000 | Distefano et al. |
| 6,056,572 A | 5/2000 | Matsumoto et al. |
| 6,063,640 A | 5/2000 | Mizukoshi et al. |
| 6,072,323 A | 6/2000 | Hembree et al. |
| 6,083,837 A | 7/2000 | Millet |
| 6,084,312 A | 7/2000 | Lee |
| 6,089,904 A | 7/2000 | Wu |
| 6,133,534 A | 10/2000 | Fukutomi et al. |
| 6,142,789 A | 11/2000 | Nolan et al. |
| 6,146,151 A | 11/2000 | Li |
| 6,156,484 A | 12/2000 | Bassous et al. |
| 6,170,808 B1 | 1/2001 | Kutschi |
| 6,181,144 B1 | 1/2001 | Hembree et al. |
| 6,184,699 B1 | 2/2001 | Smith et al. |
| 6,191,368 B1 | 2/2001 | Di Stefano et al. |
| 6,196,852 B1 | 3/2001 | Neumann et al. |
| 6,200,143 B1 | 3/2001 | Haba et al. |
| 6,203,347 B1 | 3/2001 | Crane |
| 6,204,065 B1 | 3/2001 | Ochiai |
| 6,205,660 B1 | 3/2001 | Fjelstad et al. |
| 6,208,157 B1 | 3/2001 | Akram et al. |
| 6,218,848 B1 | 4/2001 | Hembree et al. |
| 6,220,869 B1 | 4/2001 | Grant et al. |
| 6,221,750 B1 | 4/2001 | Fjelstad |
| 6,224,392 B1 | 5/2001 | Fasano et al. |
| 6,250,933 B1 | 6/2001 | Khoury et al. |
| 6,255,727 B1 | 7/2001 | Khoury |
| 6,255,736 B1 | 7/2001 | Kaneko |
| 6,263,566 B1 | 7/2001 | Hembree et al. |
| 6,264,477 B1 | 7/2001 | Smith et al. |
| 6,293,806 B1 | 9/2001 | Yu |
| 6,293,808 B1 | 9/2001 | Ochiai |
| 6,297,164 B1 | 10/2001 | Khoury et al. |
| 6,298,552 B1 | 10/2001 | Li |
| 6,300,782 B1 | 10/2001 | Hembree et al. |
| 6,306,752 B1 | 10/2001 | DiStefano et al. |
| 6,315,616 B1 | 11/2001 | Hayashi |
| 6,332,801 B1 | 12/2001 | Watanbe |
| 6,335,210 B1 | 1/2002 | Farooq et al. |
| 6,336,269 B1 | 1/2002 | Eldridge et al. |
| 6,337,575 B1 | 1/2002 | Akram |
| 6,345,987 B1 | 2/2002 | Mori et al. |
| 6,352,436 B1 | 3/2002 | Howard |
| 6,361,328 B1 | 3/2002 | Gosselin |
| 6,373,267 B1 | 4/2002 | Hiroi |
| 6,374,487 B1 | 4/2002 | Haba et al. |
| 6,375,474 B1 | 4/2002 | Harper, Jr. et al. |
| 6,384,475 B1 | 5/2002 | Beroz et al. |
| 6,392,524 B1 | 5/2002 | Biegelsen et al. |
| 6,392,534 B1 | 5/2002 | Flick |
| 6,397,460 B1 | 6/2002 | Hembree |
| 6,399,900 B1 | 6/2002 | Khoury et al. |
| 6,402,526 B1 | 6/2002 | Schreiber et al. |
| 6,409,521 B1 | 6/2002 | Rathburn |
| 6,420,661 B1 | 7/2002 | Di Stefano et al. |
| 6,420,789 B1 | 7/2002 | Tay et al. |
| 6,420,884 B1 | 7/2002 | Khoury et al. |
| 6,428,328 B2 | 8/2002 | Haba et al. |
| 6,431,881 B1 | 8/2002 | Engbring et al. |
| 6,436,802 B1 | 8/2002 | Khoury |
| 6,437,591 B1 | 8/2002 | Faynworth et al. |
| 6,442,039 B1 | 8/2002 | Schreiber |
| 6,447,305 B1 | 9/2002 | Roberts |
| 6,452,407 B2 | 9/2002 | Khoury et al. |
| 6,454,573 B2 | 9/2002 | Hayashi et al. |
| 6,461,892 B2 | 10/2002 | Beroz |
| 6,465,748 B2 | 10/2002 | Yamanashi et al. |
| 6,472,890 B2 | 10/2002 | Khoury et al. |
| 6,474,997 B1 | 11/2002 | Ochiai |
| 6,492,251 B1 | 12/2002 | Haba et al. |
| 6,497,581 B2 | 12/2002 | Slocum et al. |
| 6,517,362 B2 | 2/2003 | Hirai et al. |
| 6,520,778 B1 | 2/2003 | Eldridge et al. |
| 6,524,115 B1 | 2/2003 | Gates et al. |
| 6,551,112 B1 | 4/2003 | Li et al. |
| 6,558,187 B2 | 5/2003 | Aoki |
| 6,576,485 B2 | 6/2003 | Zhou et al. |
| 6,577,003 B1 | 6/2003 | Crane et al. |
| 6,604,950 B2 | 8/2003 | Maldonado et al. |
| 6,612,861 B2 | 9/2003 | Khoury et al. |
| 6,616,966 B2 | 9/2003 | Mathieu et al. |
| 6,622,380 B1 | 9/2003 | Grigg |
| 6,627,092 B2 | 9/2003 | Clements et al. |
| 6,640,432 B1 | 11/2003 | Mathieu et al. |
| 6,661,247 B2 | 12/2003 | Maruyama et al. |

| | | | | | | |
|---|---|---|---|---|---|---|
| 6,663,399 B2 | 12/2003 | Ali et al. | | 7,140,883 B2 | 11/2006 | Khandros et al. |
| 6,664,131 B2 | 12/2003 | Jackson | | 7,189,090 B2 | 3/2007 | Aizawa et al. |
| 6,669,489 B1 | 12/2003 | Dozier, II et al. | | 7,210,942 B2 | 5/2007 | Uchida et al. |
| 6,671,947 B2 | 1/2004 | Bohr | | 7,238,044 B2 | 7/2007 | Uchida et al. |
| 6,672,879 B2 | 1/2004 | Neidich et al. | | 7,244,125 B2 | 7/2007 | Brown et al. |
| 6,677,245 B2 | 1/2004 | Zhou et al. | | 7,245,137 B2 | 7/2007 | Eldridge et al. |
| 6,692,263 B2 | 2/2004 | Villain et al. | | 7,252,540 B2 | 8/2007 | Tanaka |
| 6,692,265 B2 | 2/2004 | Kung et al. | | 7,261,569 B2 | 8/2007 | Uchida et al. |
| 6,700,072 B2 | 3/2004 | DiStefano et al. | | 7,261,595 B2 | 8/2007 | Shino |
| 6,701,612 B2 | 3/2004 | Khandros et al. | | 7,263,771 B2 * | 9/2007 | Ochiai ........................ 29/877 |
| 6,719,569 B2 | 4/2004 | Ochiai | | 7,285,015 B2 | 10/2007 | Helbok et al. |
| 6,730,134 B2 | 5/2004 | Neidich | | 7,371,073 B2 | 5/2008 | Williams |
| 6,733,326 B2 | 5/2004 | Lee | | 2001/0001080 A1 | 5/2001 | Eldridge et al. |
| 6,736,664 B2 | 5/2004 | Ueda et al. | | 2001/0024890 A1 | 9/2001 | Maruyama et al. |
| 6,736,665 B2 | 5/2004 | Zhou et al. | | 2002/0006744 A1 | 1/2002 | Tashiro |
| 6,749,459 B2 | 6/2004 | Urbaniak et al. | | 2002/0008966 A1 | 1/2002 | Fjelstad et al. |
| 6,750,136 B2 | 6/2004 | Zhou et al. | | 2002/0011859 A1 | 1/2002 | Smith et al. |
| 6,750,551 B1 | 6/2004 | Frutschy et al. | | 2002/0055282 A1 | 5/2002 | Eldridge et al. |
| 6,763,581 B2 | 7/2004 | Hirai et al. | | 2002/0055289 A1 | 5/2002 | Murakami et al. |
| 6,791,171 B2 | 9/2004 | Mok et al. | | 2002/0058356 A1 | 5/2002 | Oya |
| 6,814,584 B2 | 11/2004 | Zaderej | | 2002/0079120 A1 | 6/2002 | Eskildsen et al. |
| 6,814,587 B2 | 11/2004 | Ma | | 2002/0117330 A1 | 8/2002 | Eldridge et al. |
| 6,815,961 B2 | 11/2004 | Mok et al. | | 2002/0129894 A1 | 9/2002 | Liu et al. |
| 6,821,129 B2 | 11/2004 | Tsuchiya | | 2002/0133941 A1 | 9/2002 | Akram et al. |
| 6,843,659 B2 | 1/2005 | Liao et al. | | 2002/0146919 A1 | 10/2002 | Cohn |
| 6,847,101 B2 | 1/2005 | Fjelstad et al. | | 2002/0178331 A1 | 11/2002 | Beardsley et al. |
| 6,848,173 B2 | 2/2005 | Fjelstad et al. | | 2003/0000739 A1 | 1/2003 | Frutschy et al. |
| 6,848,929 B2 | 2/2005 | Ma | | 2003/0003779 A1 | 1/2003 | Rathburn |
| 6,853,210 B1 | 2/2005 | Farnworth et al. | | 2003/0022503 A1 | 1/2003 | Clements et al. |
| 6,857,880 B2 | 2/2005 | Ohtsuki et al. | | 2003/0035277 A1 | 2/2003 | Saputro et al. |
| 6,869,290 B2 | 3/2005 | Brown et al. | | 2003/0049951 A1 | 3/2003 | Eldridge et al. |
| 6,869,307 B2 | 3/2005 | Endo | | 2003/0064635 A1 | 4/2003 | Ochiai |
| 6,881,070 B2 | 4/2005 | Chiang | | 2003/0089936 A1 | 5/2003 | McCormack et al. |
| 6,887,085 B2 | 5/2005 | Hirai | | 2003/0092293 A1 | 5/2003 | Ohtsuki et al. |
| 6,898,580 B1 | 5/2005 | Curran et al. | | 2003/0096512 A1 | 5/2003 | Cornell |
| 6,898,773 B1 | 5/2005 | Teig et al. | | 2003/0099097 A1 | 5/2003 | Mok et al. |
| 6,902,425 B2 | 6/2005 | Huang | | 2003/0129866 A1 | 7/2003 | Romano et al. |
| 6,916,181 B2 | 7/2005 | Brown et al. | | 2003/0147197 A1 | 8/2003 | Uriu et al. |
| 6,920,689 B2 | 7/2005 | Khandros et al. | | 2003/0194832 A1 | 10/2003 | Lopata et al. |
| 6,923,656 B2 | 8/2005 | Novotny et al. | | 2004/0029411 A1 | 2/2004 | Rathburn |
| 6,926,536 B2 | 8/2005 | Ochiai | | 2004/0033717 A1 | 2/2004 | Peng |
| 6,939,143 B2 | 9/2005 | Rathburn | | 2004/0072467 A1 | 4/2004 | Jordan et al. |
| 6,957,963 B2 * | 10/2005 | Rathburn ..................... 439/66 | | 2004/0118603 A1 | 6/2004 | Chambers |
| 6,960,924 B2 | 11/2005 | Akram | | 2004/0127073 A1 | 7/2004 | Ochiai |
| 6,976,888 B2 | 12/2005 | Shirai | | 2005/0088193 A1 | 4/2005 | Haga |
| 6,980,017 B1 | 12/2005 | Farnworth et al. | | 2005/0142900 A1 | 6/2005 | Boggs et al. |
| 6,995,557 B2 | 2/2006 | Goldfine et al. | | 2005/0167816 A1 | 8/2005 | Khandros et al. |
| 6,995,577 B2 * | 2/2006 | Farnworth et al. .......... 324/754 | | 2005/0208788 A1 | 9/2005 | Dittmann |
| 7,001,208 B2 | 2/2006 | Huang | | 2005/0287828 A1 | 12/2005 | Stone et al. |
| 7,002,362 B2 | 2/2006 | Farnworth et al. | | 2006/0028222 A1 | 2/2006 | Farnworth et al. |
| 7,004,775 B1 | 2/2006 | Sakurai et al. | | 2006/0281361 A1 | 12/2006 | Uchida et al. |
| 7,009,413 B1 | 3/2006 | Alghouli | | 2007/0054544 A1 | 3/2007 | Hirata |
| 7,021,941 B1 | 4/2006 | Chuang et al. | | 2007/0054545 A1 | 3/2007 | Takahira |
| 7,021,970 B2 | 4/2006 | Ozai | | 2007/0105433 A1 | 5/2007 | Shioda et al. |
| 7,025,601 B2 | 4/2006 | Dittmann | | 2007/0123074 A1 | 5/2007 | Nishimura |
| D521,455 S | 5/2006 | Radza | | 2007/0178751 A1 | 8/2007 | Yamamoto |
| D521,940 S | 5/2006 | Radza | | 2007/0259539 A1 | 11/2007 | Brown et al. |
| 7,048,548 B2 | 5/2006 | Mathieu et al. | | 2007/0269997 A1 | 11/2007 | Eldridge et al. |
| 7,053,482 B2 | 5/2006 | Cho | | 2007/0275579 A1 | 11/2007 | Si et al. |
| D522,461 S | 6/2006 | Radza | | 2008/0045076 A1 | 2/2008 | Dittmann et al. |
| D522,972 S | 6/2006 | Long et al. | | 2008/0050958 A1 | 2/2008 | Hashiguchi et al. |
| 7,056,131 B1 | 6/2006 | Williams | | 2008/0076282 A1 | 3/2008 | Yamaji et al. |
| 7,063,560 B2 | 6/2006 | Asao | | | | |
| D524,756 S | 7/2006 | Radza | | | FOREIGN PATENT DOCUMENTS | |
| 7,070,419 B2 | 7/2006 | Brown et al. | | | | |
| 7,074,074 B2 | 7/2006 | Zhang et al. | | EP | 1280241 A1 | 1/2003 |
| 7,083,425 B2 | 8/2006 | Chong et al. | | EP | 0839321 B1 | 1/2006 |
| 7,086,869 B1 | 8/2006 | Dangler et al. | | WO | WO 9743653 | 11/1997 |
| 7,090,503 B2 | 8/2006 | Dittmann | | WO | WO-9743653 A1 | 11/1997 |
| 7,097,496 B2 | 8/2006 | Zhang et al. | | WO | WO 2005034296 | 4/2005 |
| 7,112,089 B1 | 9/2006 | Liu et al. | | WO | WO-2005034296 A1 | 4/2005 |
| 7,113,408 B2 | 9/2006 | Brown et al. | | WO | WO 2005036940 | 4/2005 |
| 7,114,961 B2 | 10/2006 | Williams | | WO | WO-2005036940 A1 | 4/2005 |

| WO | WO 2005067361 | 7/2005 |
| WO | WO-2005067361 A1 | 7/2005 |
| WO | WO-2008/131097 A2 | 10/2008 |
| WO | WO-2008/131097 A3 | 10/2008 |

OTHER PUBLICATIONS

An article entitled "Patented Socketing System for the BGA/CSP Technology" by E-tec Interconnect Ltd., pp. 1-4.

Gary B. Kromann et al., "Motorola's PowerPC 603 and PowerPC 604 RISC Microprocessor: the C4/Cermanic-ball-grid Array Interconnect Technology," Motorola Advanced Packaging Technology, Motorola, Inc., 1996, pp. 1-10.

Ravi Mahajan et al., "Emerging Directions for packaging Technologies," Intel Technology Journal, V. 6, Issue 02, May 16, 2002, pp. 62-75.

* cited by examiner

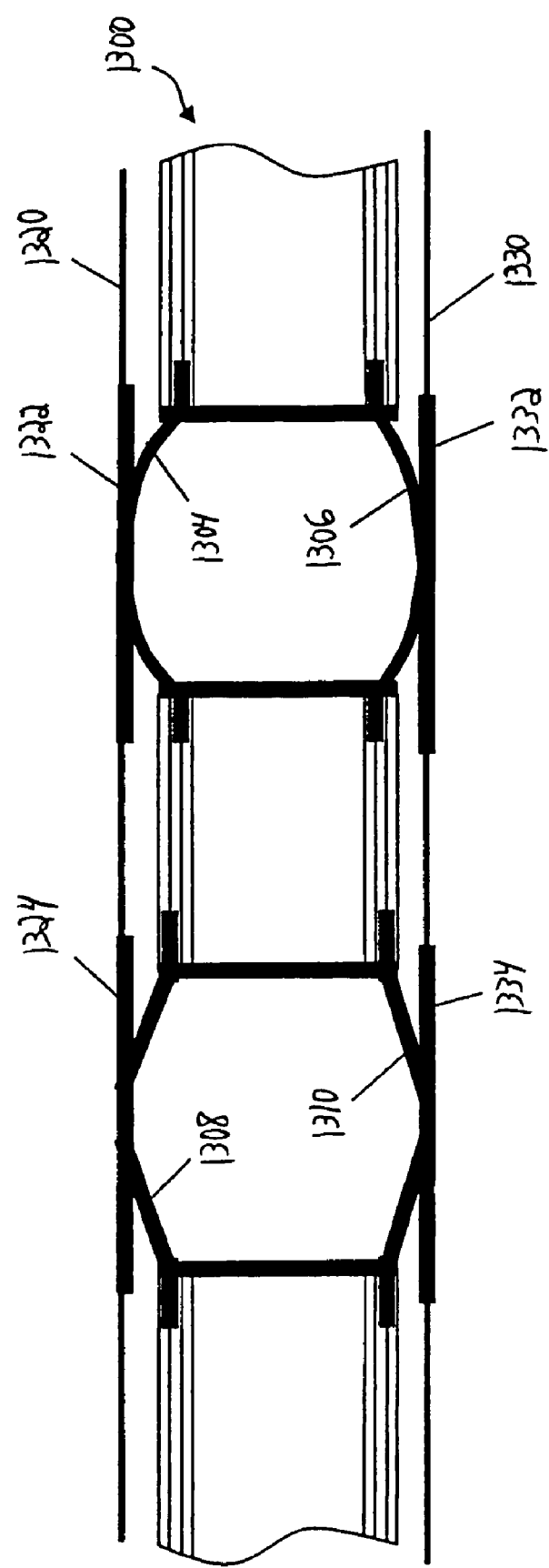

Resist film — Spring material

UV Light

Mask

Resist film

Spring material

UV Light

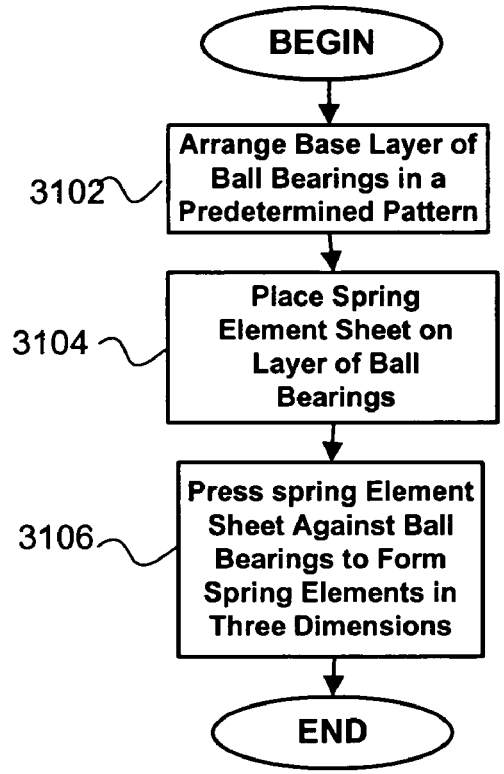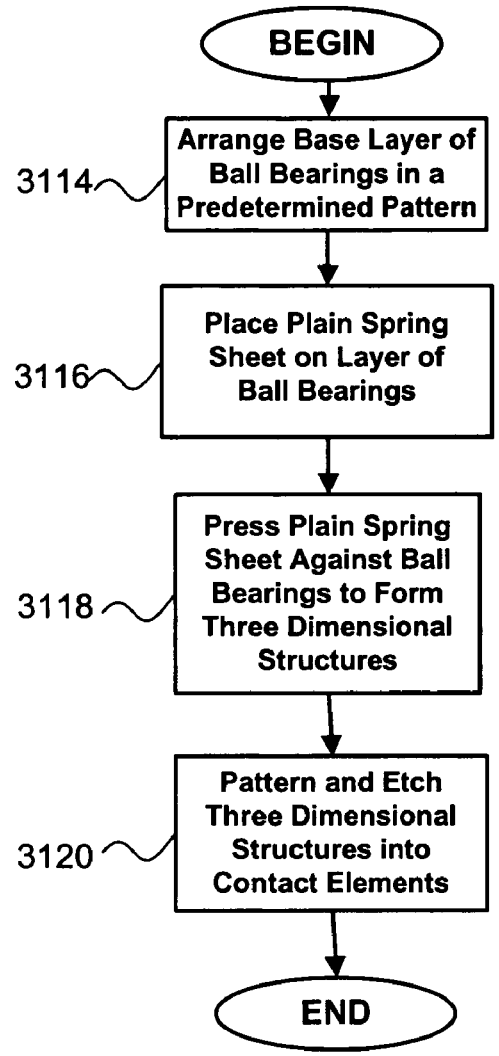
Figure 31a
Figure 31b

METHOD AND SYSTEM FOR BATCH FORMING SPRING ELEMENTS IN THREE DIMENSIONS

This application is a continuation-in-part of U.S. patent application Ser. No. 10/412,729, filed Apr. 11, 2003, which is herein incorporated by reference in their entirety.

This application also claims the benefit of U.S. Provisional Application No. 60/554,816, filed Mar. 19, 2004, and International Application No. US04/011074, Filed Apr. 9, 2004, both of which are herein incorporated by reference in its entirety.

BACKGROUND

1. Field of the Invention

The present invention relates to forming spring elements in three dimensions, and more particularly, to a method and system for batch forming spring elements in three dimensions using a configurable die.

2. Background of the Invention

Electrical interconnects or connectors are used to connect two or more electronic components together or to connect an electronic component to a piece of electrical equipment, such as a computer, router, or tester. The term "electronic component" includes, but is not limited to, printed circuit boards, and the connector can be a board-to-board connector. For instance, an electrical interconnect is used to connect an electronic component, such as an integrated circuit (an IC or a chip), to a printed circuit board. An electrical interconnect is also used during integrated circuit manufacturing for connecting an IC device under test to a test system. In some applications, the electrical interconnect or connector provides a separable or embedded or remountable connection so that the electronic component attached thereto can be removed and reattached. For example, it may be desirable to mount a packaged microprocessor chip to a personal computer motherboard using a separable interconnect device so that malfunctioning chips can be readily removed, or upgraded chips can be readily installed.

There are also applications where an electrical connector is used to make direct electrical connection to metal pads formed on a silicon wafer. Such an electrical connector is often referred to as a "probe" or "probe card" and is typically used during the testing of the wafer during the manufacturing process. The probe card, typically mounted on a tester, provides electrical connection from the tester to the silicon wafer so that individual integrated circuits formed on the wafer can be tested for functionality and compliance with specific parametric limits.

Conventional electrical connectors are usually made of stamped metal springs, which are formed and then individually inserted into an insulating carrier to form an array of electrical connection elements. Other approaches to making electrical connectors include using isotropically conductive adhesives, injection molded conductive adhesives, bundled wire conductive elements, springs formed by wirebonding techniques, and small solid pieces of metal.

Land grid array (LGA) refers to an array of metal pads (also called lands) that are used as the electrical contact points for an integrated circuit package, a printed circuit board, or other electronic component. The metal pads are usually formed using thin film deposition techniques and are coated with gold to provide a non-oxidizing surface. Ball grid array (BGA) refers to an array of solder balls or solder bumps that are used as the electrical contact points for an integrated circuit package. Both LGA and BGA packages are widely used in the semiconductor industry and each has its associated advantages or disadvantages. An LGA connector is usually used to provide removable and remountable socketing capability for LGA packages connected to PC boards or to chip modules.

Advances in electronic device packaging technology have led to shrinking package geometries and increasing lead count. That is, the spacing (or the pitch) between each component electrical connection (also referred to as a "lead") on an electronic device is decreasing, while the total number of connections is increasing. For example, existing IC packages may be built with a pitch of one mm or less with 600 or more connections. Furthermore, IC devices are designed to be operated at increasingly higher frequencies. For example, IC devices for use in telecommunication and networking applications can include input and output signals at frequencies over 1 GHz. The operating frequencies of the electronic devices, the package size, and lead count of the device packages place stringent requirements on the interconnect systems used to test or connect these electronic devices.

Advances in semiconductor technologies have also led to shrinking dimensions within semiconductor integrated circuits, and particularly to decreasing pitch for the contact points on a silicon die or a semiconductor package. For example, contact pads on a semiconductor wafer can have a pitch of 250 microns or less. At the 250 micron pitch level, it is prohibitively difficult and expensive to use conventional techniques to make separable electrical connections to these semiconductor devices. The problem is becoming even more critical as the pitch of contact pads on a semiconductor device decreases below 50 microns and simultaneous connection to multiple contact pads in an array is required. In particular, the mechanical, electrical, and reliability performance criteria of an interconnect system are becoming increasingly demanding. Conventional interconnect technologies have not been able to meet all of the mechanical, electrical, and reliability requirements for use with high speed, small dimension, and large pin count IC devices.

A particular problem encountered by today's interconnect systems is the variation in coplanarity (vertical offset) and positional misalignment of the leads in the electronic components to be connected. Coplanarity variations result in some contact elements being compressed more than others. This difference results primarily from the sum of the following three factors: (1) variations in the planarity of the package, (2) variations in the planarity of the board, and (3) any tilting of the package with respect to the board.

In a conventional LGA package, the pads (the leads) of the package can become non-planar due to substrate warping. When the amount of the resulting vertical offset exceeds the tolerance of a LGA connector, some of the pads may not be able to make electrical contact with the connector at all. Planarity variations of the pads of an LGA component make it difficult to make high quality and reliable electrical connections to all the leads of the electronic component.

Moreover, the location of the leads may also deviate from their predefined ideal position due to manufacturing limitations, resulting in positional misalignment. An effective interconnect must accommodate the horizontal positional variations of the leads of the electronic components to be connected. To make matters worse, the positional deviation of a lead relative to the lead size itself, due to either coplanarity variations, positional misalignments, or both, on an electronic device from its ideal location increases as the size of the package decreases.

Planarity problems are not limited to IC packages but may also exist on the printed circuit board (PCB) to which these IC packages are attached. Planarity problems may exist for LGA pads formed as an area array on a PCB due to warping of the PCB substrate. Typically, deviation from flatness in a conventional PCB is on the order of 50 to 75 microns or more per inch. The LGA connector must be able to accommodate the overall deviations in coplanarity between the components being connected, a package and a PCB for example. This means that the contact elements must function in both the least compressed state, where the curvature and tilt of the package and PCB are such that they are farthest apart from each other, and the most compressed state, where the curvature and tilt of the package and PCB are such that they are closest together. Hence, it is desirable to have a scalable electrical contact element that can behave elastically so that normal variations in coplanarity and positional misalignment of the contact points can be tolerated.

While LGA connectors can be effectively used to electrically connect an LGA package to printed circuit boards or modules, the connector interface between the connector and the component to be connected are subject to potential reliability degradation. For instance, corrosive materials or particulate debris can enter the interface area, preventing a proper electrical connection from being made. Also, the repeated mating and separation of an LGA package may degrade the LGA connector, causing intermittent connection conditions and inhibit reliable electrical connection.

When making electrical connections to contact pads, such as metal pads on a silicon wafer or on a LGA package, it is important to have a wiping action or a piercing action when the contact elements engage the pads in order to break through any oxide, organic material, or other films that may be present on the surface of the metal pads and that might otherwise inhibit the electrical connection. FIG. 1 illustrates an existing contact element engaging a metal pad on a substrate. Referring to FIG. 1, a connector 100 includes a contact element 102 for making an electrical connection to a metal pad 104 on a substrate 106. The connector 100 can be a wafer probe card and the contact element 102 is then a probe tip for engaging the pad 104. Under normal processing and storage conditions, a film 108, which can be an oxide film or an organic film, forms on the surface of the pad 104. When the contact element 102 engages the pad 104, the contact element 102 must pierce through the film 108 in order to make a reliable electrical connection to the pad 104. The piercing of the film 108 can be performed by a wiping action or a piercing action of contact element 102 when the contact element 102 engages the pad 104.

While it is necessary to provide a wiping or piercing action, it is important to have a well-controlled wiping or piercing action that is strong enough to penetrate the surface film 108 but soft enough to avoid damaging the metal pad 104 when electrical contact is made. Furthermore, it is important that any wiping action provides a sufficient wiping distance so that enough of the metal surface is exposed for a satisfactory electrical connection.

Similarly, when making contacts to solder balls, it is important to provide a wiping or piercing action to break through the native oxide layer on the solder balls to create a good electrical contact to the solder balls. However, when conventional approaches are used to make electrical contact to solder balls, the solder balls may be damaged or dislodged from the package. FIG. 2a illustrates the existing contact element 100 being applied to contact a solder ball 200 formed on a substrate 202. When the contact element 102 contacts the solder ball 200, such as for testing, the contact element 102 applies a piercing action which often results in the formation of a crater 204 on the top surface (also called the base surface) of the solder ball 200.

When the substrate 202 is subsequently attached to another semiconductor device, the crater 204 in the solder ball 200 can lead to void formation at the solder ball interface. FIGS. 2b and 2c illustrate the result of attaching the solder ball 200 to a metal pad 210 of a substrate 212. After solder reflow (FIG. 2c), the solder ball 200 is attached to the metal pad 210. However, a void 214 is formed at the solder ball interface due to the presence of the crater 204 on the top surface of the solder ball 200. The presence of the void 214 can affect the electrical characteristics of the connection and more importantly, degrades the reliability of the connection.

Conventional interconnect devices, such as stamped metal springs, bundled wire, and injection molded conductive adhesives, become difficult to manufacture as the dimensions are scaled down. Stamped metal spring elements, in particular, become brittle and difficult to manufacture as the dimensions are scaled down, rendering them unsuitable for accommodating electronic components with normal positional variations. This is particularly true when the spacing between the contacts scales below one millimeter, as well as where the electrical path length requirement also scales to below one millimeter to minimize inductance and meet high frequency performance requirements. At this size, spring elements made by existing manufacturing technologies become even more brittle and less elastic and cannot accommodate normal variations in system coplanarity and positional misalignments with a reasonable insertion force of about 30 to 40 grams per contact.

It is desirable to provide an electrical contact element that can provide a controlled wiping action on a metal pad, particularly for pads with a pitch of less than 50 microns. It is also desirable that the wiping action provides a wiping distance of up to 50% of the contact pad. Furthermore, when electrical contact to solder balls are made, it is desirable to have an electrical contact element that can provide a controlled wiping action on the solder ball without damaging the contact surface of the solder ball.

It is desirable to provide an electrical interconnect system which can accommodate normal positional tolerances, such as coplanarity variations and positional misalignments, in electronic components to be connected. Furthermore, it is desirable to provide an electrical interconnect system adapted for use with small geometry, high lead density electronic devices operating at high frequencies.

Existing methods and systems of forming spring elements in three dimensions have utilized custom tools, which are often designed for a specific size spring element, are not configurable, and are expensive to manufacture. There is therefore a need for a method and system for forming spring elements in three dimensions that is flexible, configurable to different spring element characteristics, and low in cost.

BRIEF DESCRIPTION OF THE DRAWINGS

FIG. 3f is a schematic diagram of a plan view of the contact arm array shown in FIG. 3a.

FIGS. 13a to 13c are schematic diagrams of cross-sectional views of one configuration of a connector being applied in a hot-swapping operation.

FIG. 15b is a schematic diagrams of a top view of the coaxial contact element of FIG. 15a.

FIG. 16 a schematic diagram that shows the mating of an LGA package to a PC board through the connector of FIG. 15a.

FIG. 23b is a schematic diagram of a side view of the assembled stack up shown in FIG. 23a.

FIG. 31a is a flowchart of an exemplary method for batch forming spring elements in accordance with the present invention.

FIG. 31b is a flowchart of an exemplary method for batch forming spring elements as shown in FIG. 30.

DETAILED DESCRIPTION

Figure 1:
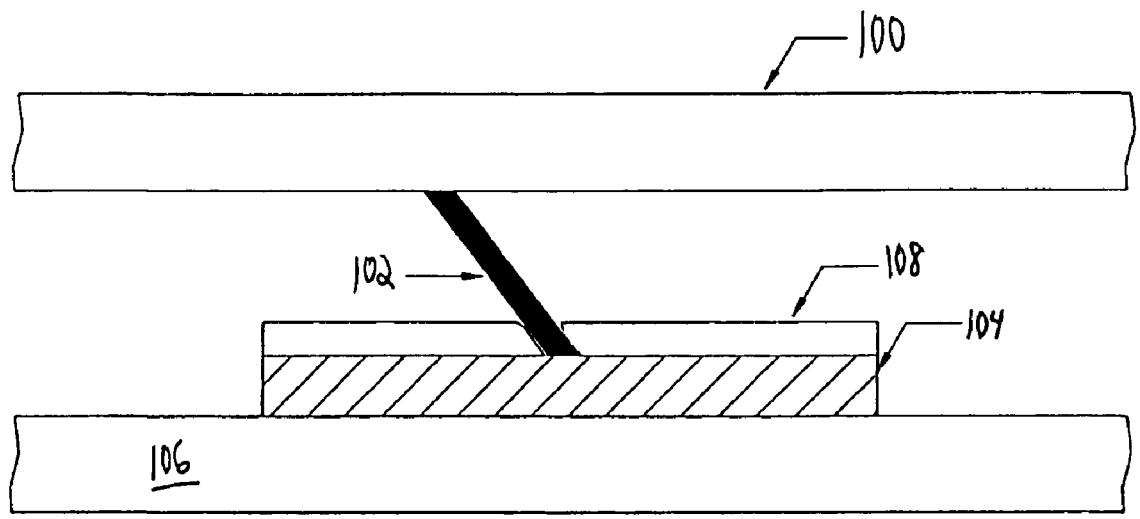
FIG. 1 is a schematic diagram of an existing contact element engaging a metal pad on a substrate.
Figure 2A:
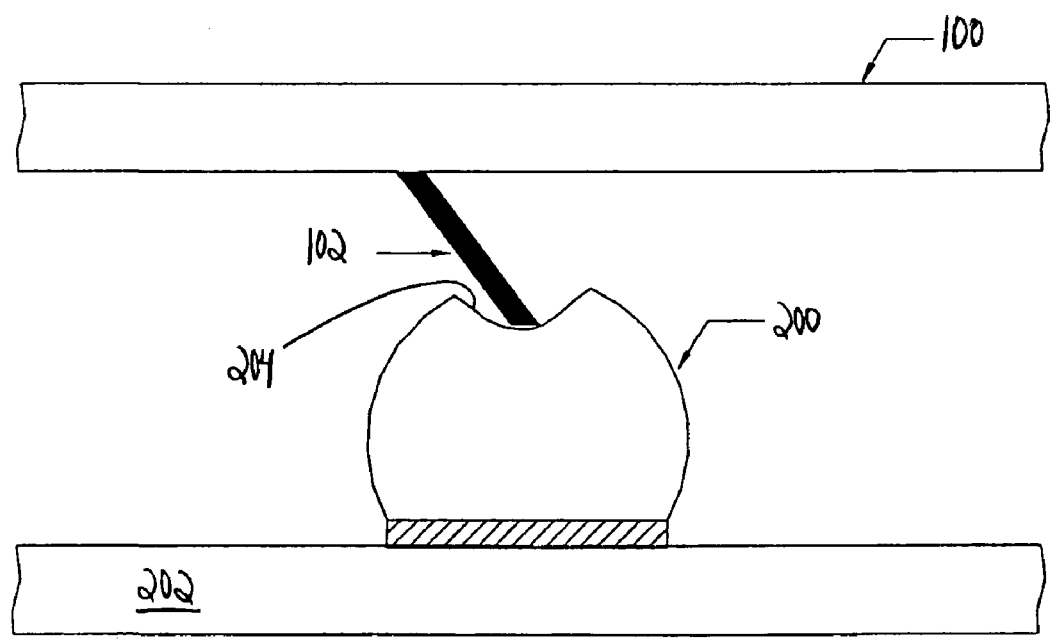
FIG. 2a is schematic diagram of an existing contact element contacting a solder ball.
Figure 2B:
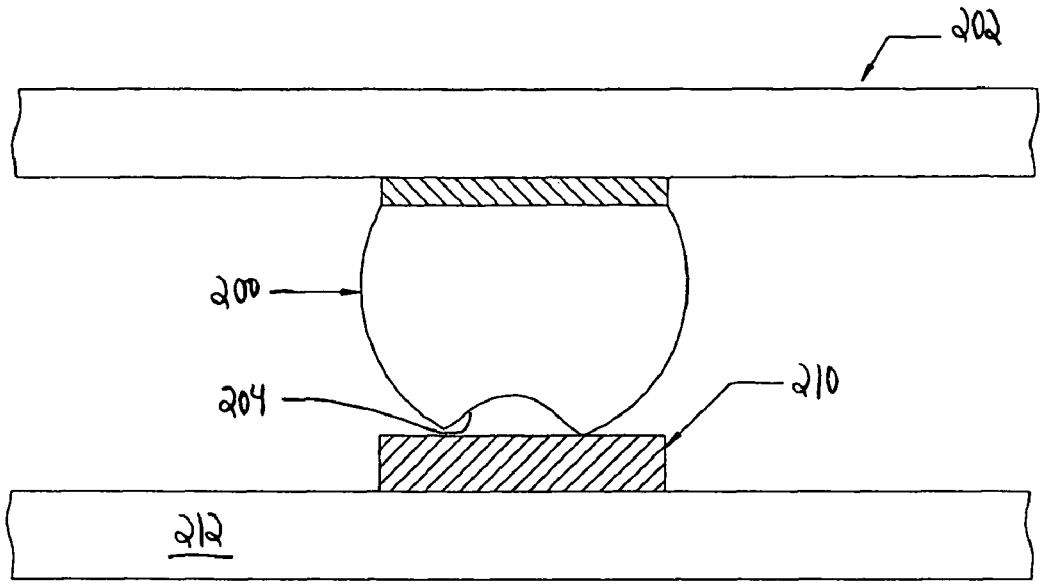
FIGS. 2b and 2c are schematic diagrams illustrating the result of attaching a damaged solder ball to a metal pad of a substrate.
Figure 2C:
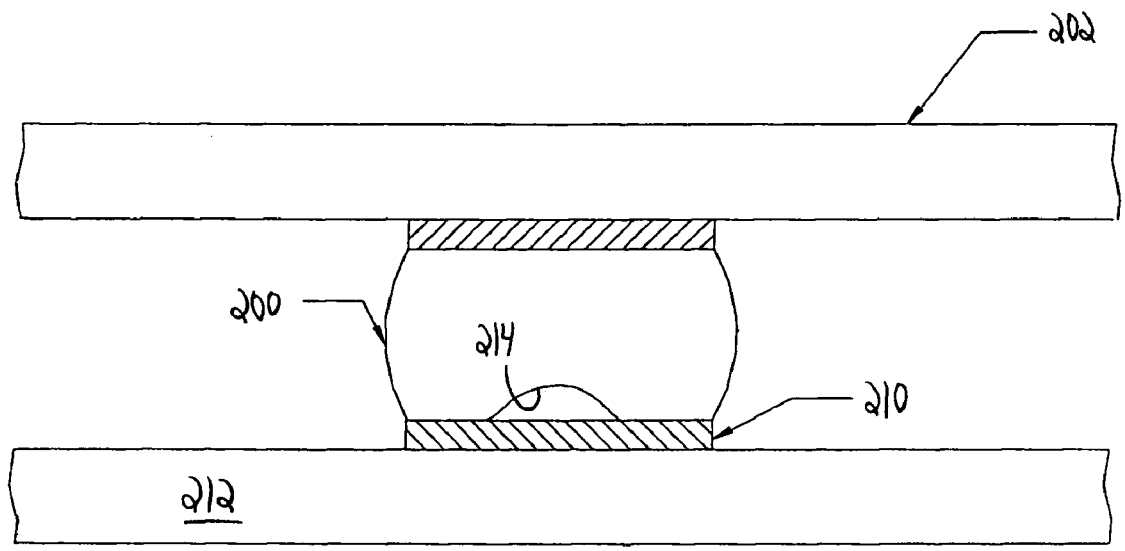
Figure 3A:
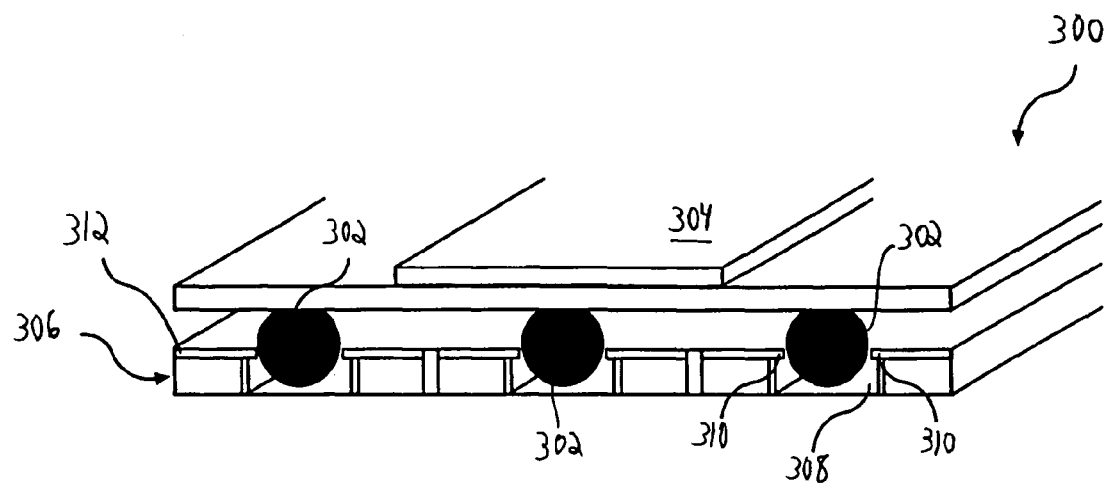
FIGS. 3a and 3b are schematic diagrams of enlarged, perspective sectional views of a beam ball grid array (BBGA) system of the present invention and its attachment to a printed circuit board (PCB).
Figure 3B:
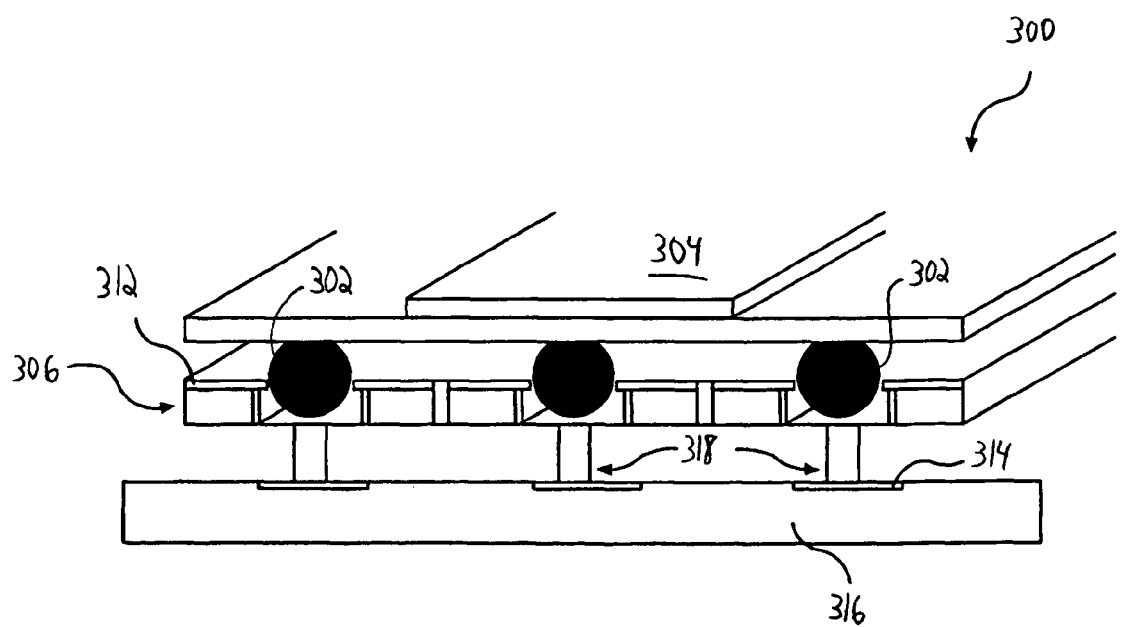

FIGS. 3a and 3b are cross-sectional views of a beam ball grid array (BBGA) system constructed in accordance with the present invention. In the first construction 300 illustrated in FIG. 3a, solder balls 302 provide a method of establishing an electrical contact between the device, packages, or module 304, and a carrier 306. The solder balls 302 are shown disposed within plated through holes or vias 308 that have been fabricated into the carrier 306 by printed circuit techniques. The solder balls 302 are given elasticity by virtue of their suspension upon flexible contact arms 310 formed as part of a layer 312. The contact arms 310 cradle the solder ball 302, as shown in FIG. 3e, and provide a spring-like support as shown in FIGS. 3c and 3d.

Figure 3C:
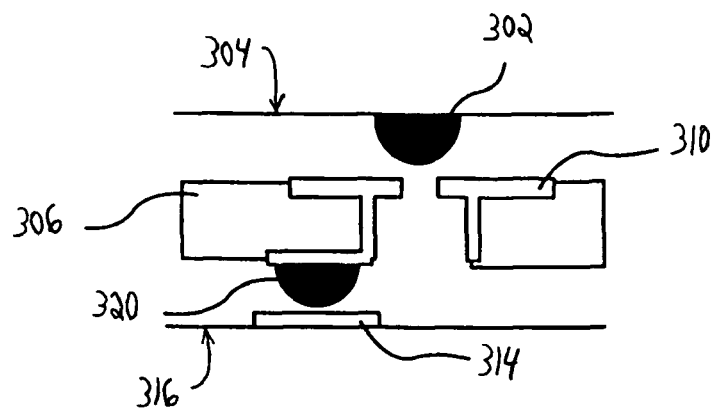
FIGS. 3c and 3d are schematic diagrams of sectional views of two respective contact schemes used to electrically connect the contact system of FIG. 3a to a PCB.
Figure 3D:
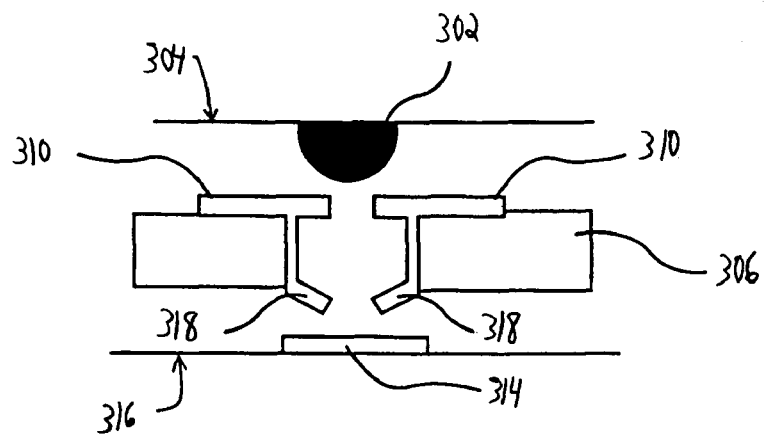
Figure 3E:
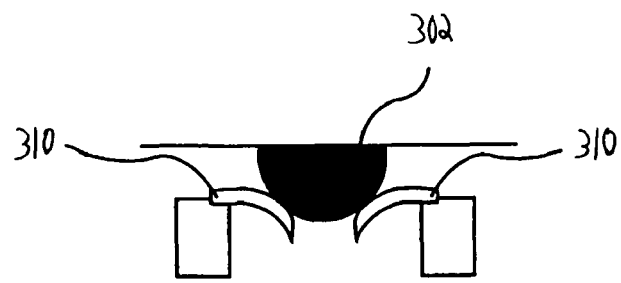
FIG. 3e is a schematic diagram of the structure for cradling a solder ball, in accordance with the configuration shown in FIGS. 3a and 3b.
Figure 3G:
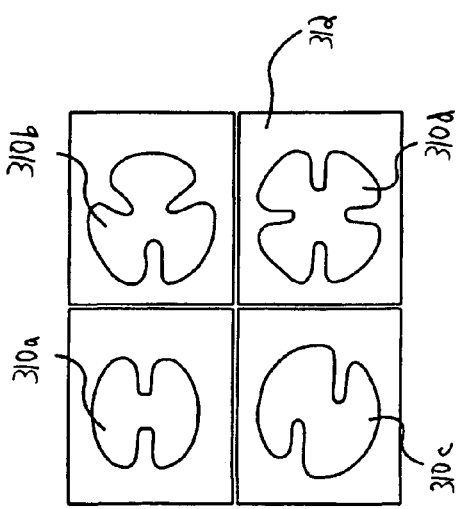
FIG. 3g is a schematic diagram of a plan view of several different exemplary contact arm designs.
Figure 3F:
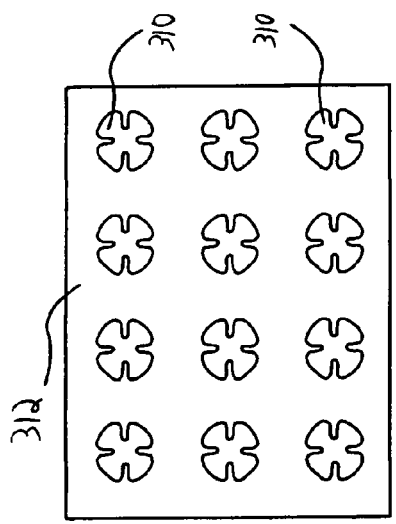

An array of contact arms 310 is fabricated in layer 312, as better observed with reference to FIG. 3f. Different design patterns for the contact arms 310 are respectively illustrated by elements 310a, 310b, 310c, and 310d in FIG. 3g.

In FIG. 3b, the fabrication continues with the attachment of the structure 300 to a pad 314 of a PCB 316 by means of electrical contact elements 318, which may include beam land grid array (BLGA) contact elements, a LGA, a pin grid array (PGA), or other types of contact elements as described below.

In FIG. 3c, the carrier 306 makes electrical contact with the PCB 316 by means of a solder ball 320 that touches the pad 314. In FIG. 3d, the carrier 306 makes contact with the pad 314 by means of contact arms 318. The contact arms 310 can be stamped or etched with the desired geometry. As will be described in greater detail hereinafter, they are then assembled in a PCB-like fabrication process.

Figure 4B:
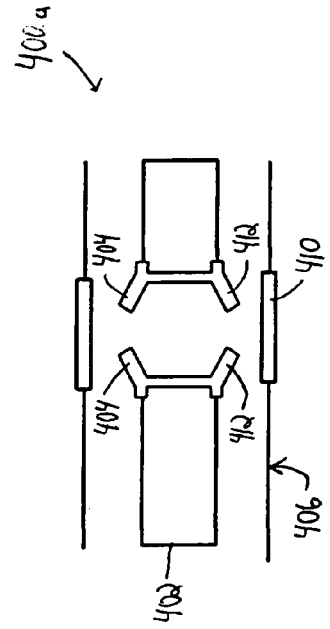
FIG. 4b is a schematic diagram of a cross-sectional view of an exemplary separable version of a BLGA system and its attachment to a PCB.
Figure 4A:
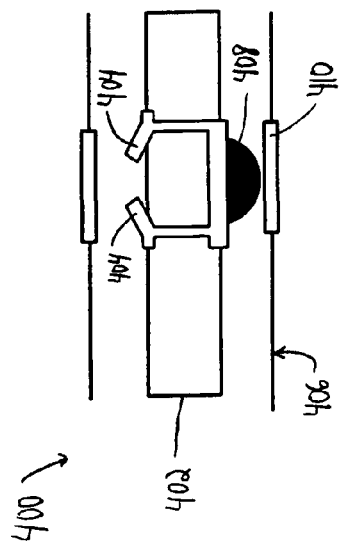
FIG. 4a is a schematic diagram of a cross-sectional view of an exemplary surface mount version of a beam land grid array (BLGA) system and its attachment to a PCB.

FIG. 4a is a cross-sectional view of a surface mount version of a BLGA electrical contact element 400 constructed in accordance with the present invention. The BLGA system includes a carrier layer 402 having an array of arms 404 that form elastic elements out of the plane of the carrier 402. The angle, thickness, and number of the arms 404 can be readily changed to provide specific design features such as contact force, current carrying capacity, and contact resistance. The carrier 402 is shown making electrical contact with a PCB 406, by means of a solder ball 408 that touches a pad 410. The arms 404 can have shapes similar to arms 310a–d in FIG. 3a.

FIG. 4b is a cross-sectional view of a separable version of a BLGA contact element 400a constructed in accordance with the present invention, including the carrier 402 making contact with the pad 410 by means of BLGA contact wipers 412, which are similar to the contact arms 404 at the top of the carrier 402.

Figure 5:
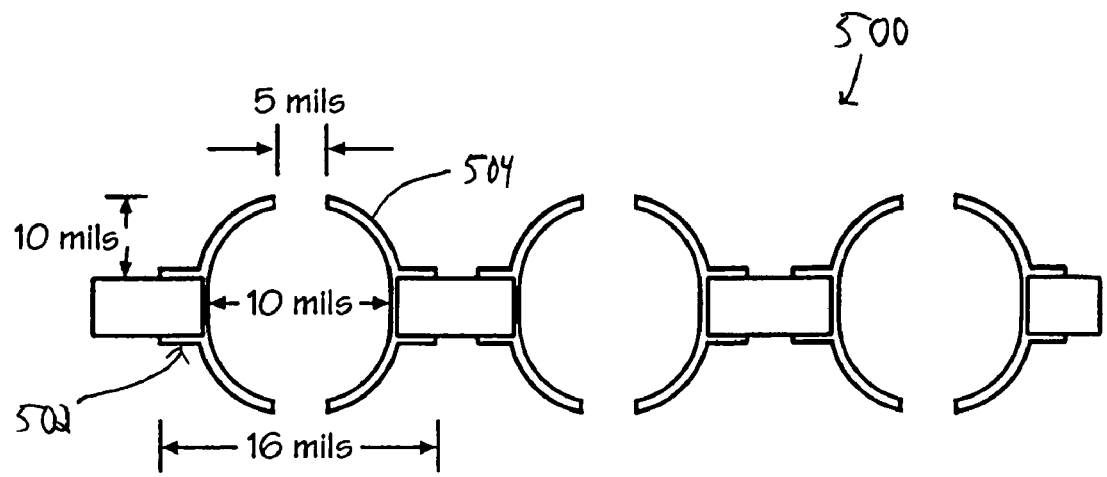
FIG. 5 is a schematic diagram of an enlarged sectional view of exemplary contact arms for a BLGA contact array.

FIG. 5 shows a cross-sectional view of a connector 500 in accordance with the present invention, including showing some exemplary dimensions for the size of the portions of the contact element 502. The spacing between the distal ends of the facing spring portions 504 is 5 mils. The height of the contact element 502 from the surface of the substrate to the top of the spring portion is 10 mils. The width of a via through the substrate can be on the order of 10 mils. The width of the contact element 502 from the outer edge of one base portion to the outer edge of the other base portion is 16 mils. Contacts of this size can be formed in accordance with the method of the invention as described below, allowing connectors with a pitch well below 50 mils and on the order of 20 mils or less. It is noted that these dimensions are merely exemplary of what can be achieved with the present invention and one skilled in the art will understand from the present disclosure that a contact element with larger or smaller dimensions could be formed.

According to one configuration of the present invention, the following mechanical properties can be specifically engineered for a contact element or a set of contact elements, to achieve certain desired operational characteristics. First, the contact force for each contact element can be selected to ensure either a low resistance connection for some contact elements or a low overall contact force for the connector. Second, the elastic working range of each contact element can be varied. Third, the vertical height of each contact element can be varied. Fourth, the pitch or horizontal dimensions of the contact element can be varied.

Figure 6:
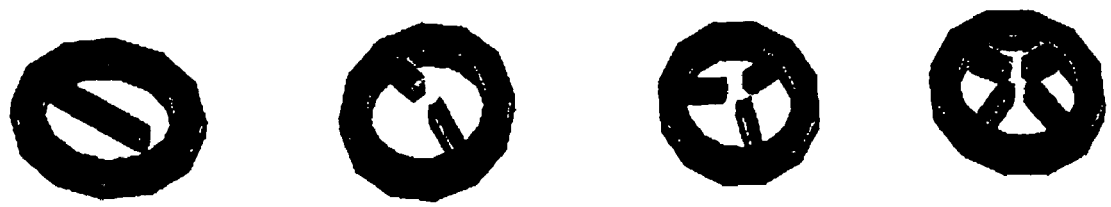
FIG. 6 is a schematic diagram of an enlarged perspective view of exemplary contact arm designs.

Referring to FIG. 6, a plurality of contact arm designs are shown for either a BBGA or a BLGA system. As aforementioned, these contacts can be either stamped or etched into a spring-like structure, and can be heat treated before or after forming.

Figure 7:
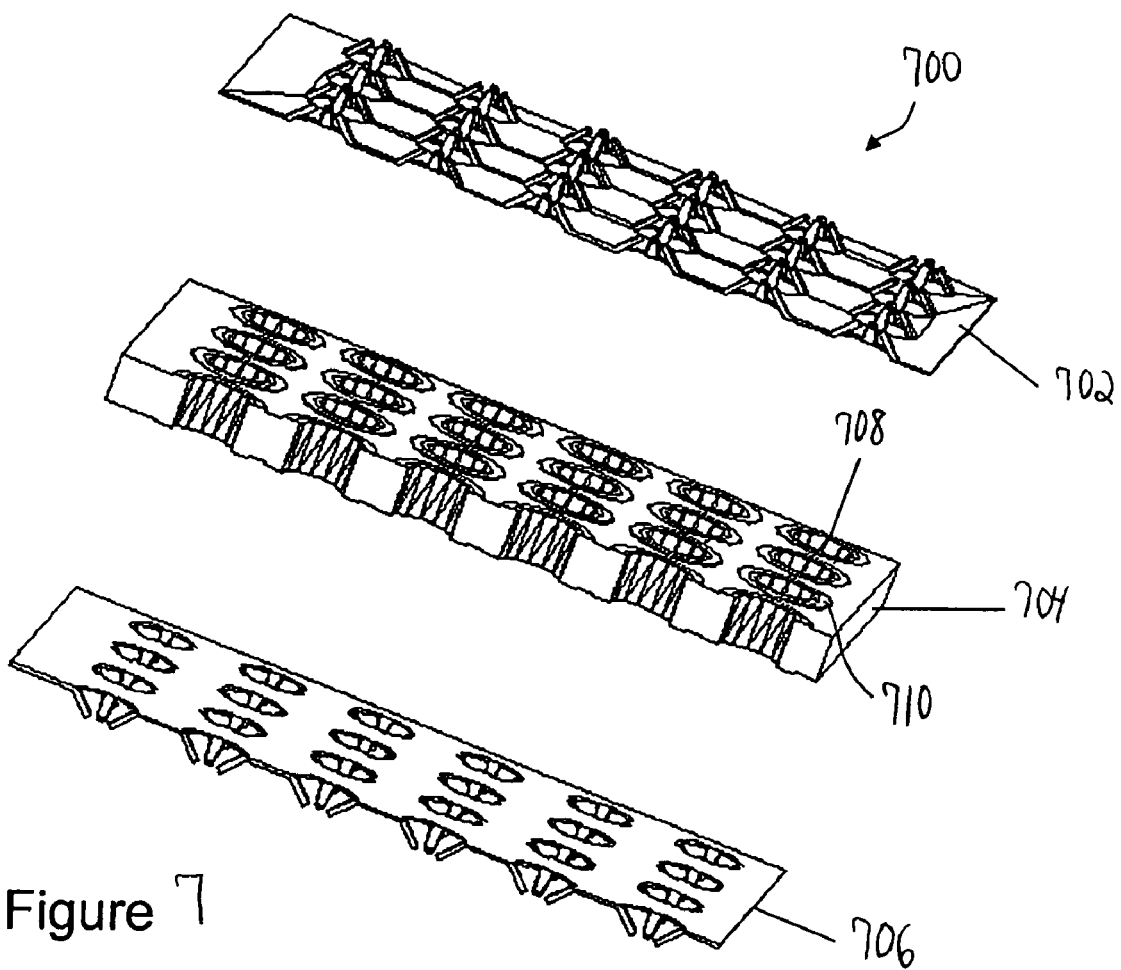
FIG. 7 is a schematic diagram of a perspective view of a connector according to one configuration of the present invention.

FIG. 7 is an exploded perspective view showing the assembly of a connector 700 according to one configuration of the present invention. The connector 700 includes a first set of contact elements 702 that are located on a first major surface of a dielectric substrate 704 and a second set of contact elements 706 that are located on a second major surface of the substrate 704. Each pair of contact elements 702 and 706 is preferably aligned with a hole 708 formed in the substrate 704. Metal traces are formed through the hole 708 to connect a contact element from the first major surface to a contact element from the second major surface.

FIG. 7 shows the connector 700 during an intermediate step in the manufacturing process for forming the connector. Therefore, the array of contact elements is shown as being connected together on a sheet of metal or metallic material from which they are formed. In the subsequent manufacturing steps, the metal sheet between the contact elements is patterned to remove unwanted portions of the metal sheet, so that the contact elements are isolated (i.e., singulated) as needed. For example, the metal sheet can be masked and etched to singulate some or all of the contact elements.

In one configuration, the connector of the present invention is formed as follows. First, the dielectric substrate 704 including conductive paths between the top surface and the bottom surface is provided. The conductive paths can be in the form of vias or an aperture 708. In one configuration, the dielectric substrate 704 is a piece of any suitable dielectric material with conductive plated through holes. A conductive metal sheet or a multilayer metal sheet is then patterned to form an array of contact elements including a base portion and one or more elastic portions. The contact elements, including the spring portions, can be formed by etching, stamping, or other means. The metal sheet is attached to the first major surface of the dielectric substrate 704. When a second set of contact elements is to be included, a second conductive metal sheet or multilayer metal sheet is similarly patterned and attached to the second major surface of the dielectric substrate 704. The metal sheets can then be patterned to remove unwanted metal from the sheets, so that the contact elements are isolated from each other (i.e., singulated) as needed. The metal sheets can be patterned by etching, scribing, stamping, or other means.

In an alternate configuration, the protrusion of the elastic portions can be formed after the metal sheet, including patterned contact elements, has been attached to the dielectric substrate. In another alternate configuration, the unwanted portions of the metal sheets can be removed before the contact elements are formed. Also, the unwanted portions of the metal sheets can be removed before the metal sheets are attached to the dielectric substrate.

Furthermore, in the configuration shown in FIG. 7, conductive traces are formed in the plated through holes 708 and also on the surface of the dielectric substrate 704 in a ring-shaped pattern 710 encircling each plated through hole. While the conductive ring 710 can be provided to enhance the electrical connection between the contact elements on the metal sheet and the conductive traces formed in the dielectric layer 704, the conductive ring 710 is not a required component of the connector 700. In one configuration, the connector 700 can be formed by using a dielectric substrate including through holes that are not plated. A metal sheet including an array of contact elements can be attached to the dielectric substrate. After the metal sheet is patterned to form individual contact elements, the entire structure can then be plated to form conductive traces in the through holes, connecting the contact elements through the holes to the respective terminals on the other side of the dielectric substrate.

Figure 8:
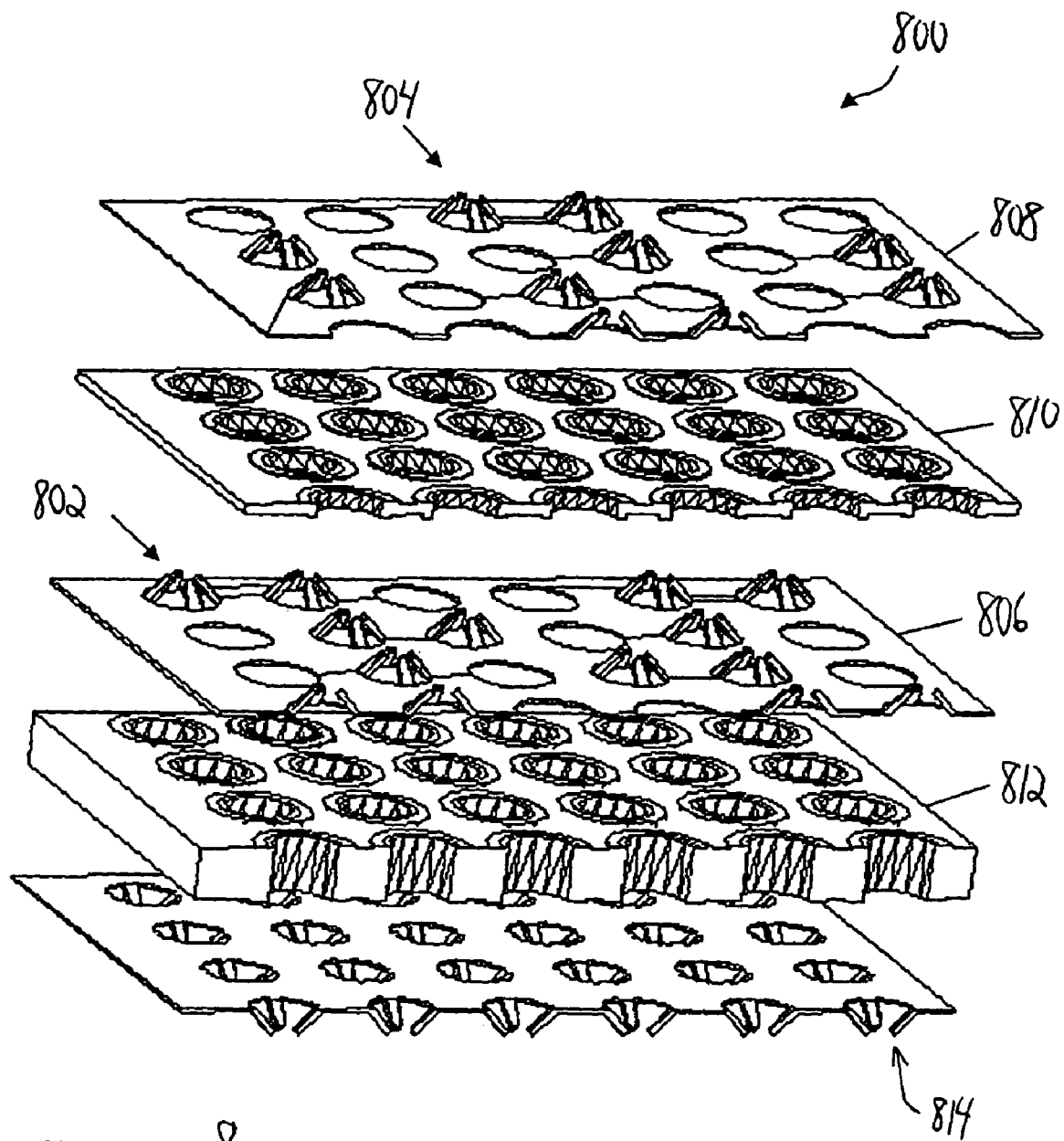
FIG. 8 is a schematic diagram of an exemplary connector including contact elements formed using multiple layers of metals according to another configuration of the present invention.

FIG. 8 illustrates a connector 800 including contact elements formed using multiple layers of metals according to another configuration of the present invention. Referring to FIG. 8, the connector 800 includes a multilayer structure for forming a first group of contact elements 802 and a second group of contact elements 804. In this configuration, the first group of contact elements 802 is formed using a first metal layer 806 and the second group of contact elements 804 is formed using a second metal layer 808. The first metal layer 806 and the second metal layer 808 are isolated by a dielectric layer 810. Each metal layer is patterned so that a group of contact elements is formed at desired locations on the specific metal layer. For instance, the contact elements 802 are formed in the metal layer 806 at predefined locations, while the contact elements 804 are formed in the metal layer 808 at locations not occupied by the contact elements 802. The different metal layers may include metal layers with different thicknesses or different metallurgies, so that the operating properties of the contact elements can be specifically tailored. Thus, by forming a selected contact element or a selected group of contact elements in a different metal layer, the contact elements of the connector 800 can be made to exhibit different electrical and mechanical properties.

In one configuration, the connector 800 can be formed using the following process sequence. The first metal layer 806 is processed to form the first group of contact elements 802. The metal layer 806 can then be attached to a dielectric substrate 812. Subsequently, an insulating layer, such as the dielectric layer 810, is located over the first metal layer 806. The second metal layer 808 can be processed to form the contact elements and attached to the dielectric layer 810. Via holes and conductive traces are formed in the dielectric substrate 812 and in the dielectric layer 810 as needed to provide a conductive path between each contact element to a respective terminal 814 on the opposing side of the substrate 812.

Figure 9A:
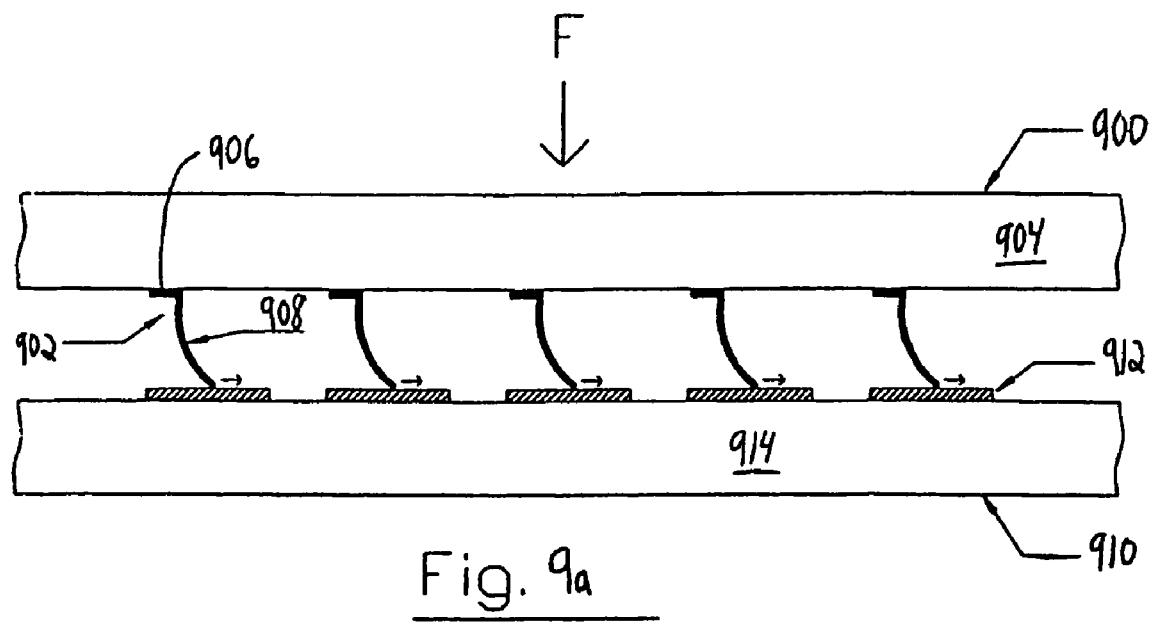
FIGS. 9a and 9b are schematic diagrams of cross-sectional views of an exemplary connector according to one configuration of the present invention.
Figure 9B:
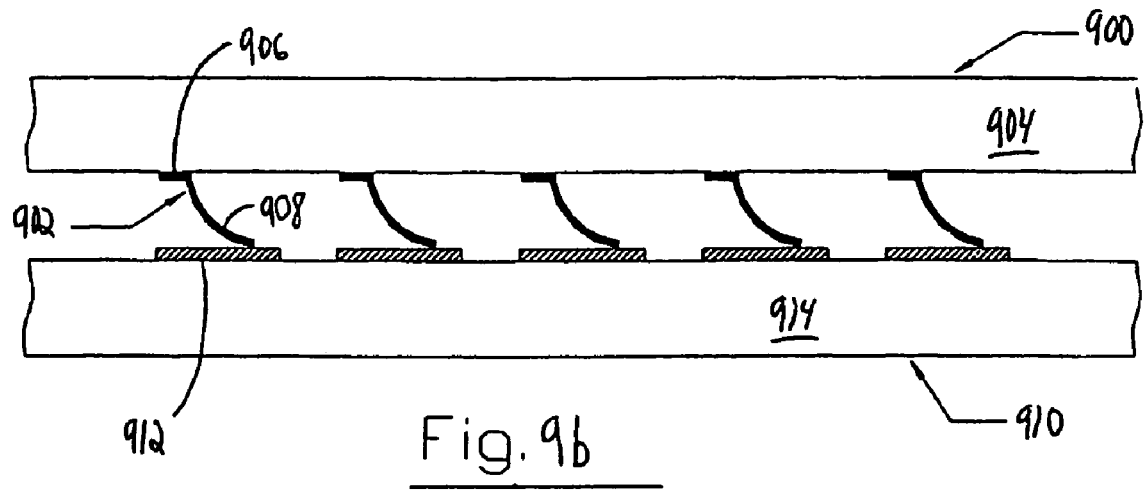

FIGS. 9a and 9b are cross-sectional views of a connector according to one configuration of the present invention. FIGS. 9a and 9b illustrate a connector 900 connected to a semiconductor device 910 including metal pads 912 formed on a substrate 914 as contact points. The semiconductor device 910 can be a silicon wafer where the metal pads 912 are the metal bonding pads formed on the wafer. The semiconductor device 910 can also be a LGA package where the metal pads 912 represent the "lands" or metal connection pads formed on the LGA package. The coupling of the connector 900 to semiconductor device 910 in FIGS. 9a and 9b is illustrative only and is not intended to limit the application of the connector 900 to connecting with wafers or LGA packages only. FIGS. 9a and 9b illustrate the connector 900 turned upside down to engage the semiconductor device 910. The use of directional terms such as "above" and "top surface" in the present description is intended to describe the relative positional relationship of the elements of the connector as if the connector is positioned with the contact elements facing upward.

Referring to FIG. 9a, the connector 900 includes an array of contact elements 902 located on a substrate 904. Because the connector 900 can be built be for connecting to semiconductor devices at semiconductor scales, the connector 900 is usually formed using materials that are commonly used in semiconductor fabrication processes. In one configuration, the substrate 904 is made of quartz, silicon, or a ceramic wafer and the contact elements 902 are located on a dielectric layer which could be a spin on silica (SOS), spin on glass (SOG), boron phosphorus tetraethoxysilane (BPTEOS), or tetraethoxysilane (TEOS) layer formed on the top surface of the substrate 904. The array of contact elements 902 is typically formed as a two-dimensional array arranged to mate with corresponding contact points on the semiconductor device 910 to be contacted. In one configuration, the connector 900 is formed to contact metal pads having a pitch of 50 microns or less. Each contact element 902 includes a base portion 906 attached to the top surface of the substrate 904 and a curved or linear spring portion 908 extending from the base portion 906. The spring portion 908 has a proximal end contiguous with the base portion 906 and a distal end projecting above the substrate 904.

The spring portion 908 is formed to curve away or angle away from a plane of contact, which is the surface of the contact point to which the contact element 902 is to be contacted, the surface of the metal pad 912. The spring portion 908 is formed to have a concave curvature with respect to the surface of the substrate 904, or is formed to be angled away from the surface of the substrate 904. Thus, the spring portion 908 curves or angles away from the surface of the metal pad 912, which provides a controlled wiping action when engaging the metal pad 912.

In operation, an external biasing force, denoted F in FIG. 9a, is applied to the connector 900 to compress the connector 900 against the metal pads 912. The spring portion 908 of the contact element 902 engages the respective metal pad 912 in a controlled wiping action, so that each contact element 902 makes an effective electrical connection to the respective pad 912. The curvature or angle of the contact elements 902 ensures that the optimal contact force is achieved concurrently with the optimal wiping distance. The wiping distance is the amount of travel the distal end of the spring portion 908 makes on the surface of the metal pad 912 when contacting the metal pad 912. In general, the contact force is on the order of five to 100 grams depending on the application, and the wiping distance is on the order of five to 400 microns.

Another feature of the contact element 902 is that the spring portion 908 enables a large elastic working range. Specifically, because the spring portion 908 can move in both the vertical and the horizontal directions, an elastic working range on the order of the electrical path length of the contact element 902 can be achieved. The "electrical path length" of the contact element 902 is defined as the distance the electrical current has to travel from the distal end of the spring portion 908 to the base portion 906 of the contact element 902. The contact elements 902 have an elastic working range that spans the entire length of the contact elements, which enables the connector to accommodate normal coplanarity variations and positional misalignments in the semiconductor or electronic devices to be connected.

The contact elements 902 are formed using a conductive metal that can also provide the desired elasticity. In one configuration, the contact elements 902 are formed using titanium (Ti) as a support structure that can later be plated to obtain a desired electrical and/or elastic behavior. In other configurations, the contact elements 902 are formed using a copper alloy (Cu-alloy) or a multilayer metal sheet such as stainless steel coated with a copper-nickel-gold (Cu/Ni/Au) multilayer metal sheet. In a preferred configuration, the contact elements 902 are formed using a small-grained copper beryllium (CuBe) alloy and then plated with electroless nickel-gold (Ni/Au) to provide a non-oxidizing surface. In an alternate configuration, the contact elements 902 are formed using different metals for the base portions and the spring portions.

In the configuration shown in FIG. 9a, the contact element 902 is shown as having a rectangular shaped base portion 906 with one spring portion 908. The contact element of the present invention can be formed in a variety of configurations and each contact element only needs to have a base portion sufficient for attaching the spring portion to the substrate. The base portion can assume any shape and can be formed as a circle or other useful shape for attaching the contact element to the substrate. A contact element can include multiple spring portions extending from the base portion.

Figure 10A:
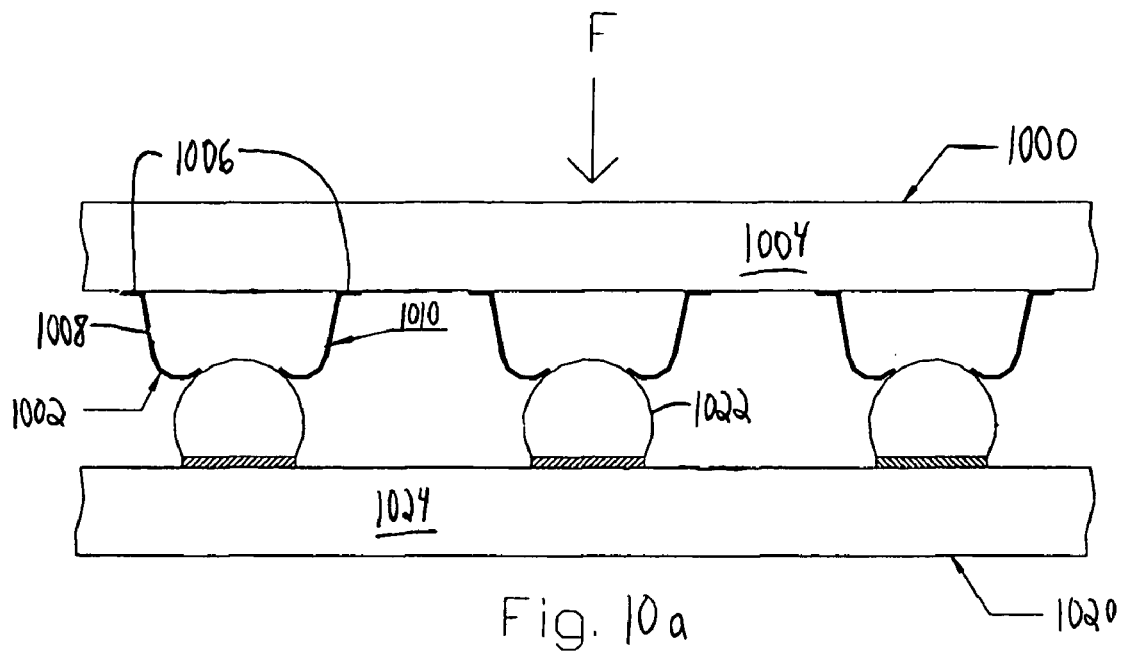
FIGS. 10a and 10b are schematic diagrams of cross-sectional views of an exemplary connector according to an alternate configuration of the present invention.
Figure 10B:
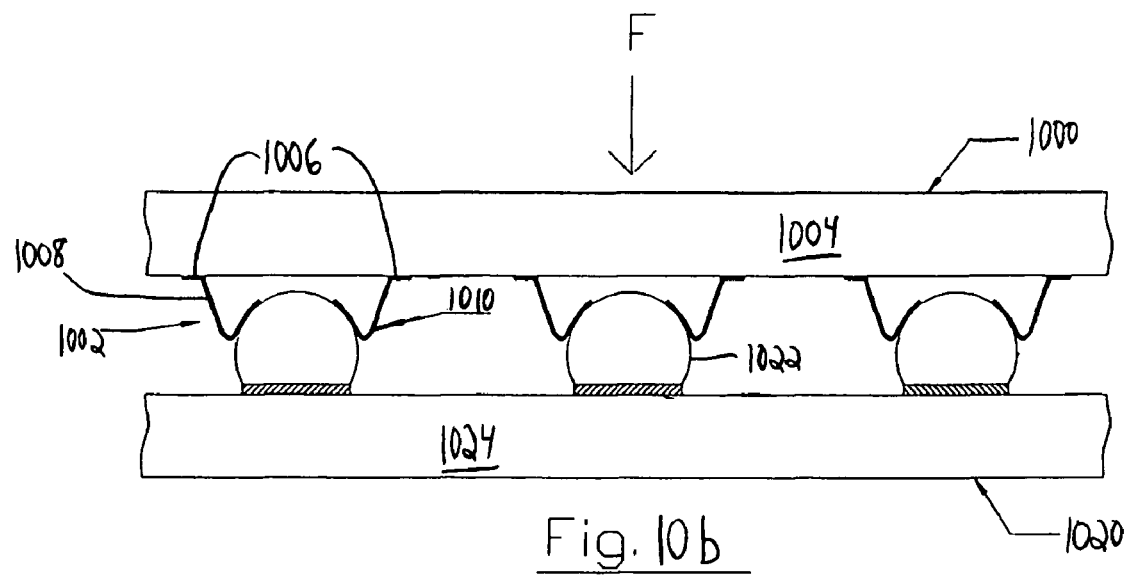

FIGS. 10a and 10b illustrate a connector 1000 according to an alternate configuration of the present invention. The connector 1000 includes an array of contact elements 1002 formed on a substrate 1004. Each contact element 1002 includes a base portion 1006 and two curved spring portions 1008 and 1010 extending from the base portion 1006. The spring portions 1008 and 1010 have distal ends, projecting above the substrate 1004 and facing towards each other. Other characteristics of the spring portions 1008 and 1010 are the same as spring portion 908. That is, the spring portions 1008 and 1010 curve away from a plane of contact and each has a curvature disposed to provide a controlled wiping action when engaging a contact point of a semiconductor device to be contacted.

The connector 1000 can be used to contact a semiconductor device 1020, such as a BGA package, including an array of solder balls 1022 mounted on a substrate 1024 as contact points. FIG. 10b illustrates the connector 1000 being fully engaged with the semiconductor device 1020. The connector 1000 can also be used to contact metal pads, such as pads on a land grid array package. However, using the connector 1000 to contact solder balls provides particular advantages.

First, the contact elements 1002 contact the respective solder balls 1022 along the side of the solder balls. No contact to the base surface of the solder ball 1022 is made. Thus, the contact elements 1002 do not damage the base surface of the solder balls 1022 during contact, and effectively eliminate the possibility of void formation when the solder balls 1022 are subsequently reflowed for permanent attachment.

Second, because the spring portions 1008 and 1010 of the contact elements 1002 are formed to curve away from the plane of contact, which in the present case is a plane tangent to the side surface of the solder ball 1022 being contacted, the contact elements 1002 provide a controlled wiping action when contacting the respective solder balls 1022. In this manner, an effective electrical connection can be made without damaging the surface of the solder balls 1022.

Third, the connector 1000 is scalable and can be used to contact solder balls having a pitch of 250 microns or less.

Lastly, because each contact element 1002 has a large elastic working range on the order of the electrical path length, the contact elements 1002 can accommodate a large range of compression. Therefore, the connector of the present invention can be used effectively to contact conventional devices having normal coplanarity variations or positional misalignments.

Figure 11:
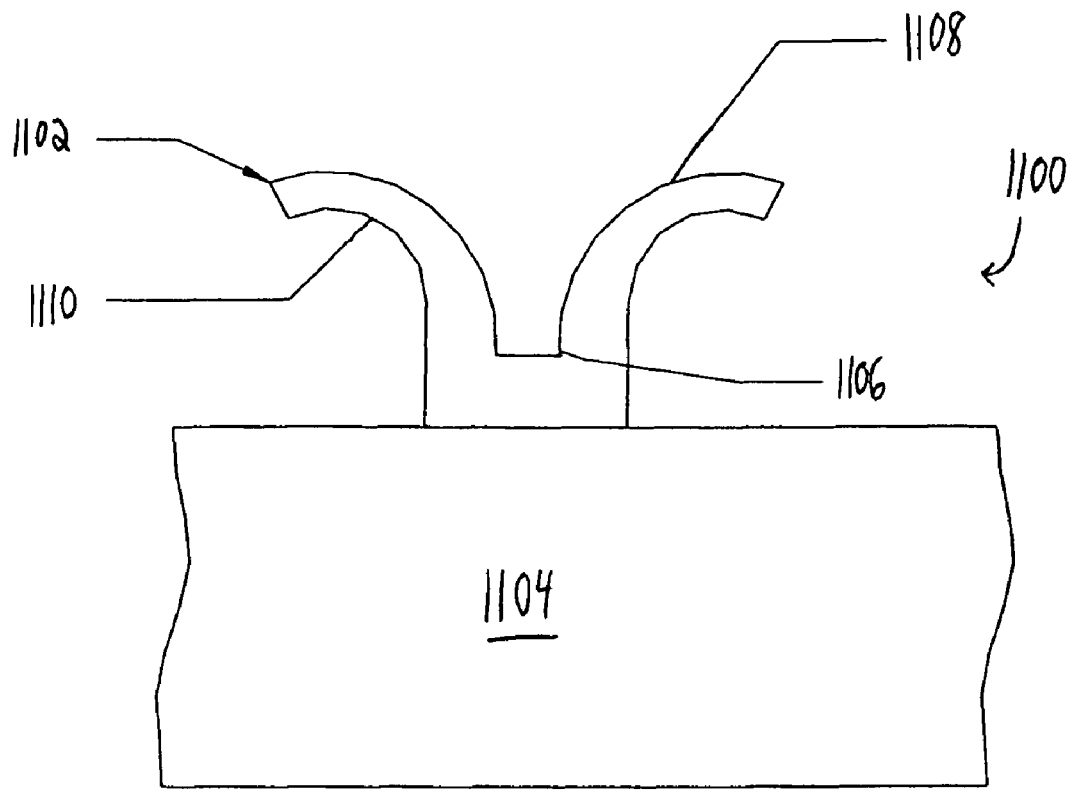
FIG. 11 is a schematic diagram of a cross-sectional view of an exemplary connector according to an alternate configuration of the present invention.
Figure 12:
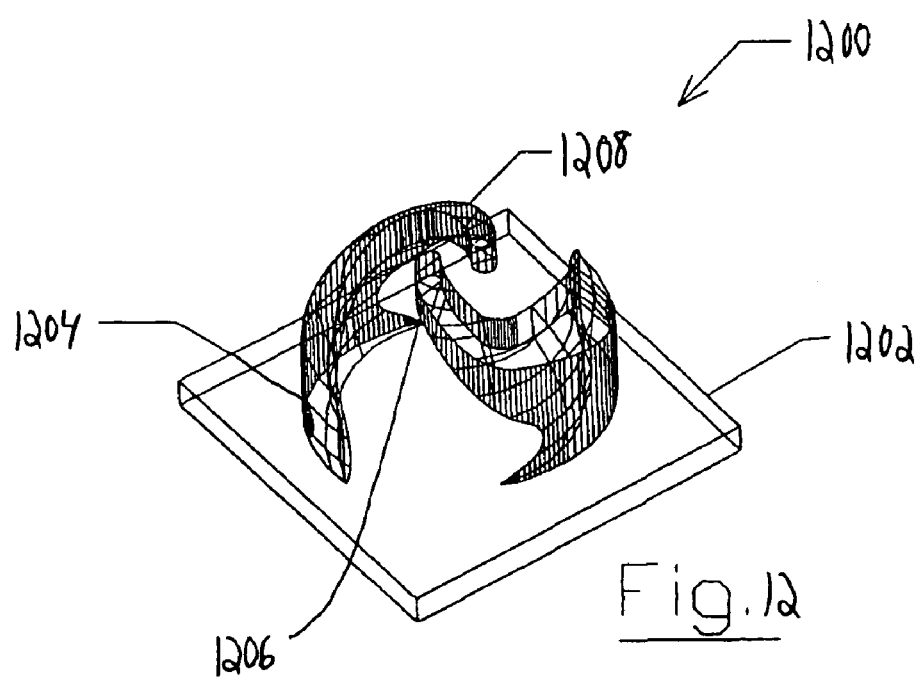
FIG. 12 is a schematic diagram of a perspective view of an exemplary connector according to an alternate configuration of the present invention.

FIGS. 11 and 12 illustrate connectors according to alternate configurations of the present invention. Referring to FIG. 11, a connector 1100 includes a contact element 102 formed on a substrate 1104. Contact element 1102 includes a base portion 1106, a first curved spring portion 1108, and a second curved spring portion 1110. The first spring portion 1108 and the second spring portion 1110 have distal ends that point away from each other. The contact element 1102 can be used to engage a contact point including a metal pad or a solder ball. When used to engage a solder ball, contact element 1102 cradles the solder ball between the first and second spring portions 1108 and 1110, similar to what is shown in FIG. 3e. Thus, the first and second spring portions 1108 and 1110 contact the side surface of the solder ball in a controlled wiping motion in a direction that curves away from the plane of contact of the solder ball.

FIG. 12 illustrates a contact element 1200 located on a substrate 1202. The contact element 1200 includes a base portion 1204, a first curved spring portion 1206 extending from the base portion 1204, and a second curved spring portion 1208 extending from the base portion 1204. The first spring portion 1206 and the second spring portion 1208 project above the substrate 1202 in a spiral configuration. The contact element 1200 can be used to contact a metal pad or a solder ball. In both cases, the first and second spring portions 1206 and 1208 curve away from the plane of contact and provide a controlled wiping action.

Figure 13A:
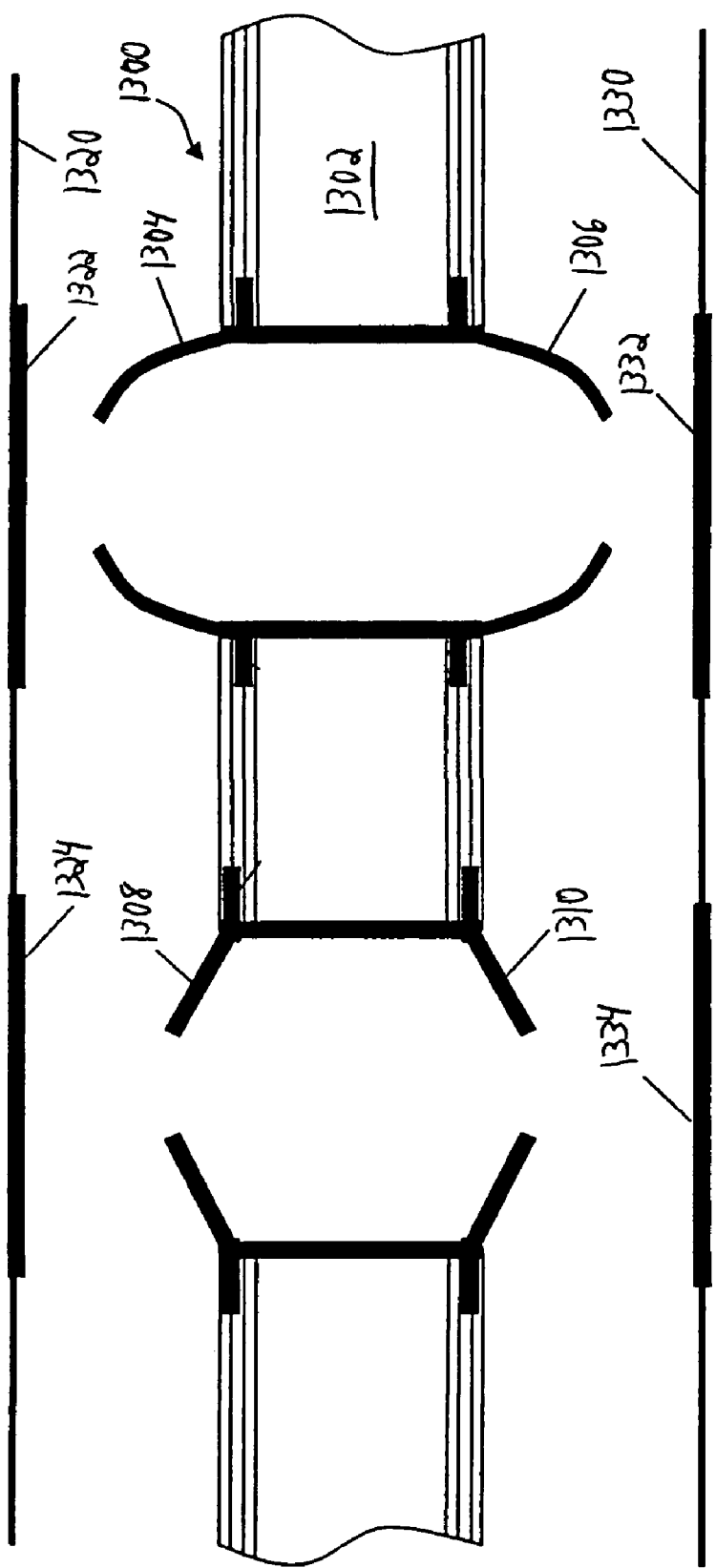
Figure 13B:
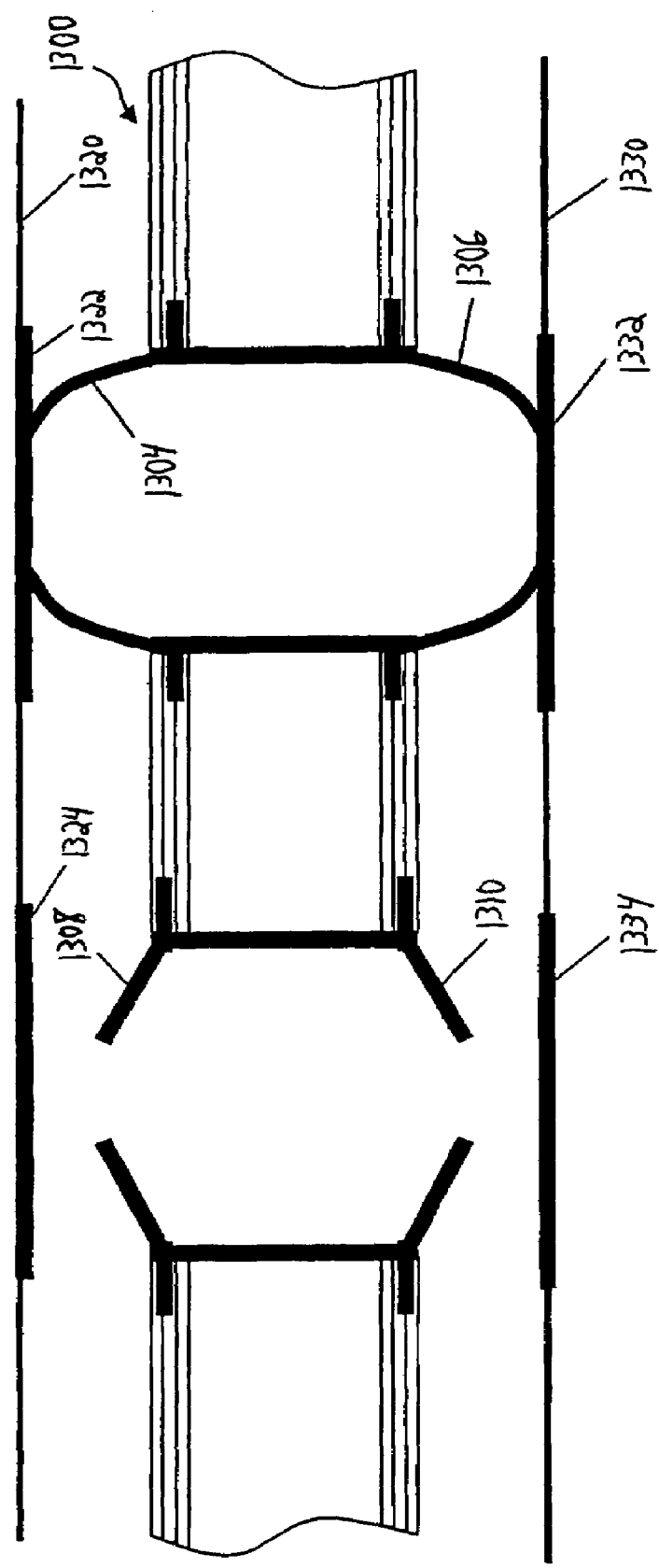

FIGS. 13a to 13c are cross-sectional views of a connector 1300 which can, for example, be applied in a hot-swapping operation. Referring to FIG. 13a, the connector 1300 is shown in an unloaded condition. The connector 1300 is to be connected to a land grid array (LGA) package 1320 and a printed circuit board (PC board) 1330. A pad 1322 on the LGA package 1320 represents a power connection (that is, either the positive power supply voltage or the ground voltage) of the integrated circuit in the LGA package 1320 which is to be connected to a pad 1335 on the PC board 1330. The pad 1332 is electrically active or "powered-up". A pad 1324 on the LGA package 1320 represents a signal pin of the integrated circuit which is to be connected to a pad 1334 on the PC board 1330. To enable a hot-swapping operation, the power pad 1322 should be connected to pad 1332 prior to the signal pad 1324 being connected to pad 1334. The connector 1300 includes contact elements 1304 and 1306 in a substrate 1302 which have an extended height and a larger elastic working range than contact elements 1308 and 1310, such that a hot-swapping operation between the LGA package 1320 and the PC board 1330 is realized using the connector 1300. The height of the contact elements 1304 and 1306 is selected to obtain the desired contact force and desired spacing to achieve a reliable hot-swapping operation.

FIG. 13b illustrates an intermediate step during the mounting process of the LGA package 1320 to the PC board 1330 using the connector 1300. When the LGA package 1320 and the PC board 1330 are compressed together against the connector 1300, pad 1322 and pad 1332 will make electrical connections to respective contact elements 1304 and 1306 prior to the pads 1324 and 1334 making connection to contact elements 1308 and 1310. In this manner, the power connection between the LGA package 1320 and the PC board 1330 is established before the signal pads are connected.

FIG. 13c illustrates the mounting of the LGA package 1320 to the PC board 1330 in a fully loaded condition. By applying further compression force, the LGA package 1320 is compressed against the connector 1300 so that contact element 1308 engages the signal pad 1324. Similarly, the PC board 1330 is compressed against the connector 1300 so that contact element 1310 engages the pad 1334. The LGA package 1320 is thus mounted onto the PC board 1330. In the connector 1300, as the taller contact elements 1304, 1306 are compressed more to allow the shorter contact elements 1308, 1310 to engage, the contact force required for the connector will increase. In order to minimize the overall contact force required for the connector, the taller contact elements 1304, 1306 can be designed with a lower spring constant than the shorter contact elements 1308, 1310 such that all contact elements are at the optimal contact force in the fully loaded condition.

Figure 14A:
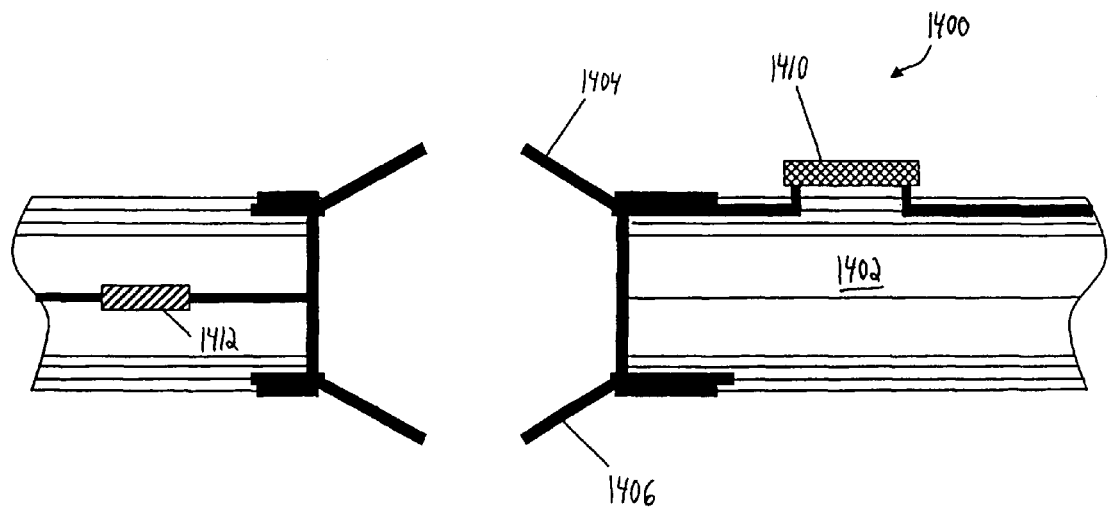
FIGS. 14a and 14b are two schematic diagrams that show configurations of a circuitized connector in accordance with the present invention.

FIG. 14a illustrates one configuration of a circuitized connector 1400 in accordance with the present invention. The connector 1400 includes a contact element 1404 on the top surface of a dielectric substrate 1402 connected to a contact element 1406 on the bottom surface of dielectric substrate 1402. The contact element 1404 is connected to a surface mounted electrical component 1410 and an embedded electrical component 1412. The electrical components 1410 and 1412 may be decoupling capacitors, for example, which are positioned on the connector 1400 so that the capacitors can be placed as close to the electronic component as possible. In conventional integrated circuit assembly, such decoupling capacitors are usually placed on the printed circuit board distant from the electronic component. Thus, a large distance exists between the electronic component to be compensated and the actual decoupling capacitor, thereby diminishing the effect of the decoupling capacitor. By using the circuitized connector 1400, the decoupling capacitors can be placed as close to the electronic component as possible to enhance the effectiveness of the decoupling capacitors. Other electrical components that may be used to circuitize the connector include a resistor, an inductor, and other passive or active electrical components.

Figure 14B:
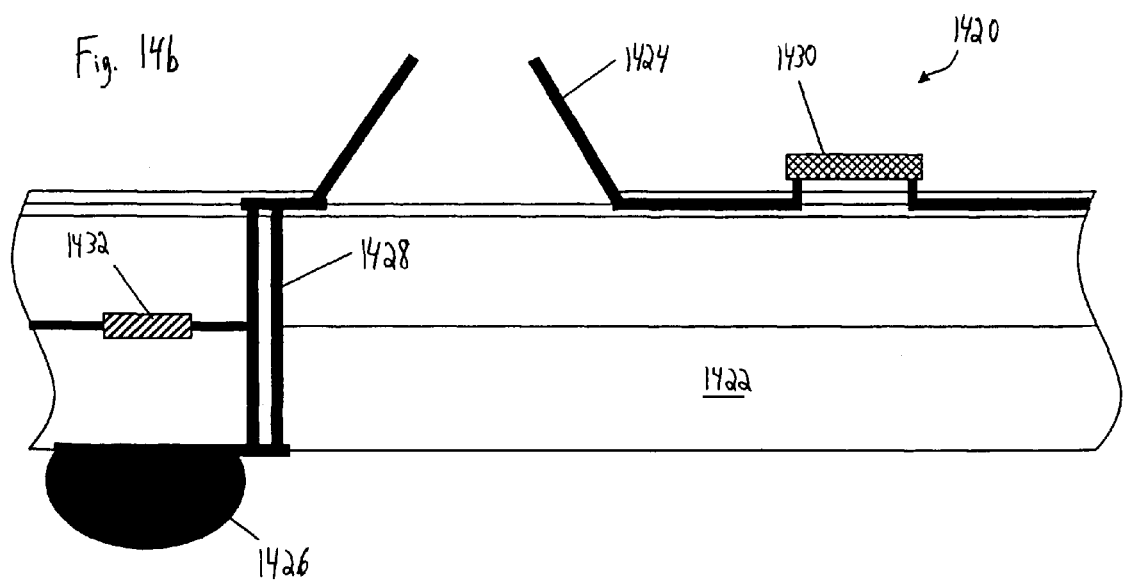

FIG. 14b illustrates another configuration of a circuitized connector according to the present invention. Connector 1420 includes a contact element 1424 on a dielectric substrate 1422 coupled to a solder ball terminal 1426 through a via 1428. The contact element 1424 is connected to a surface mounted electrical component 1430 and to an embedded electrical component 1432. The connector 1420 further illustrates that the placement of the terminal 1426 does not have to be aligned with the contact element 1424 as long as the contact element is electrically coupled to the terminal, such as through the via 1428. It is noted that a connector in accordance with the present invention can be constructed without a relief hole in the substrate. The electrical contact or via can be defined in an offset hole or in any suitable manner to provide electrical connections internally or to opposite sides of the substrate.

Figure 15A:
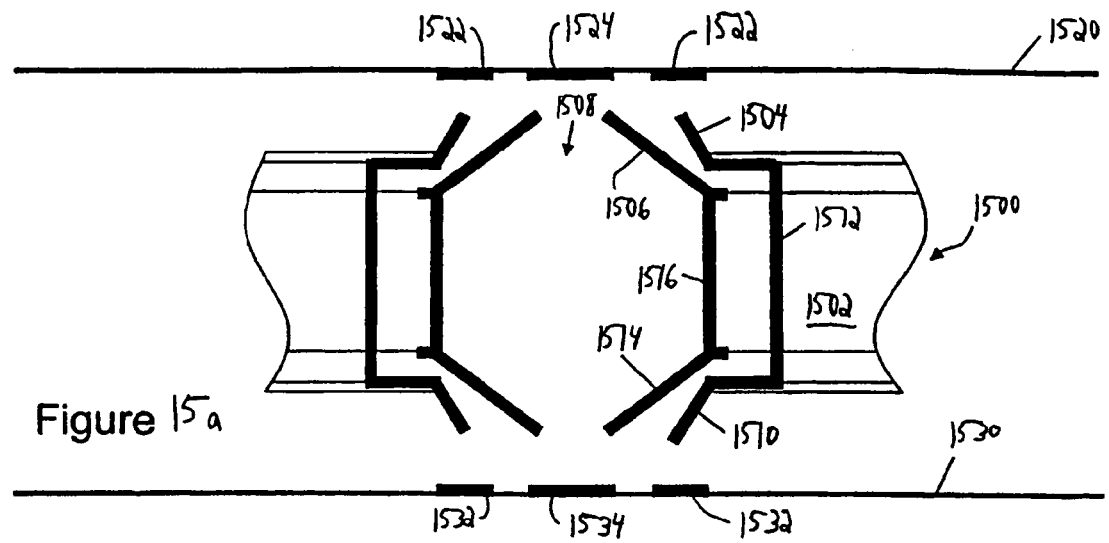
FIG. 15a is a schematic diagram of a cross-sectional view of an exemplary connector including a coaxial contact element according to an alternate configuration of the present invention.
Figure 15B:
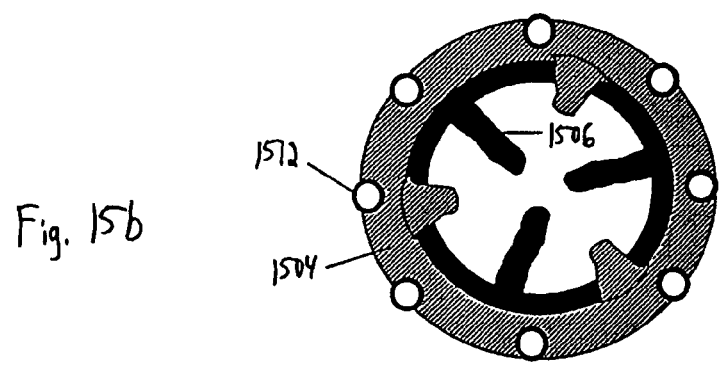

According to another aspect of the present invention, a connector can include one or more coaxial contact elements. FIGS. 15a and 15b show a connector 1500 including a coaxial contact element according to one configuration of the present invention. Referring to FIG. 15a, the connector 1500 includes a first contact element 1504 and a second contact element 1506 formed on the top surface of a dielectric substrate 1502. The contact elements 1504 and 1506 are formed in proximity to, but electrically isolated from, each other. The contact element 1504 includes a base portion formed as an outer ring of an aperture 1508 while the contact element 1506 includes a base portion formed as an inner ring of the aperture 1508. Each of the contact elements 1504, 1506 includes three elastic portions (FIG. 15b). The elastic portions of the contact element 1504 do not overlap with the elastic portions of the contact element 1506. The contact element 1504 is connected to a contact element 1510 on the bottom surface of the dielectric substrate 1502 through at least one via 1512. The contact elements 1504 and 1510 form a first current path, referred to as the outer current path of the connector 1500. The contact element 1506 is connected to a contact element 1514 on the bottom surface of the dielectric substrate 1502 through a metal trace 1516 formed in the aperture 1508. The contact elements 1506 and 1514 form a second current path, referred to as the inner current path of the connector 1500.

Figure 16:
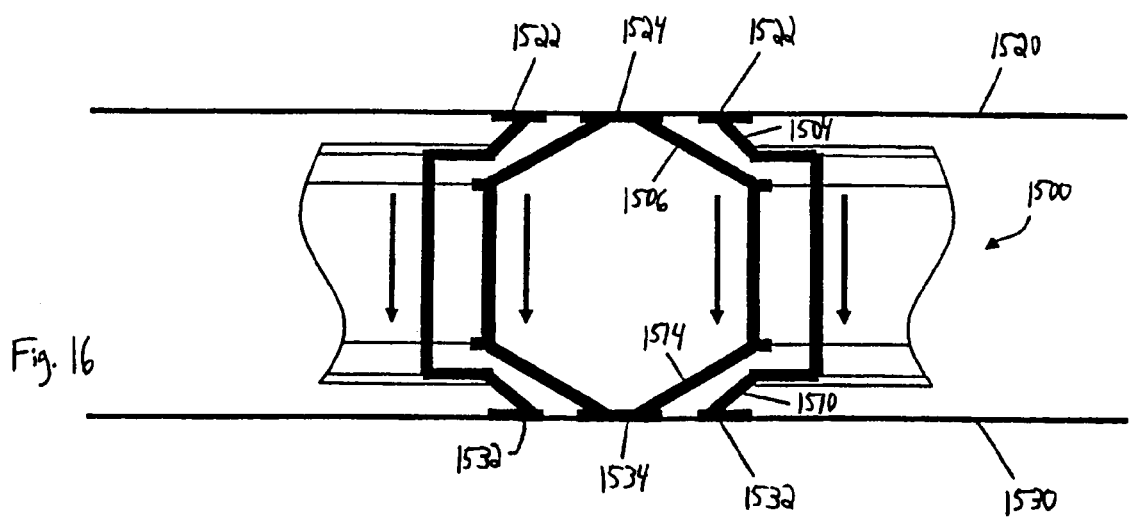

As thus constructed, the connector 1500 can be used to interconnect a coaxial connection on a LGA package 1520 to a coaxial connection on a PC board 1530. FIG. 16 illustrates the mating of the LGA package 1520 to the PC board 1530 through the connector 1500. When the LGA package 1520 is mounted to the connector 1500, the contact element 1504 engages a pad 1522 on the LGA package 1520. Similarly, when the PC board 1530 is mounted to the connector 1500, the contact element 1510 engages a pad 1532 on the PC board 1530. As a result, the outer current path between pad 1522 and pad 1532 is formed. Typically, the outer current path constitutes a ground potential connection. The contact element 1506 engages a pad 1524 on the LGA package 1520 while the contact element 1514 engages a pad 1534 on the PC board 1530. As a result, the inner current path between pad 1524 and pad 1534 is formed. Typically, the inner current path constitutes a high frequency signal.

A particular advantage of the connector 1500 is that the coaxial contact elements can be scaled to dimensions of one millimeter or less. Thus, the connector 1500 can be used to provide a coaxial connection even for small geometry electronic components.

Method for Making an Electrical Connector

Figure 17A:
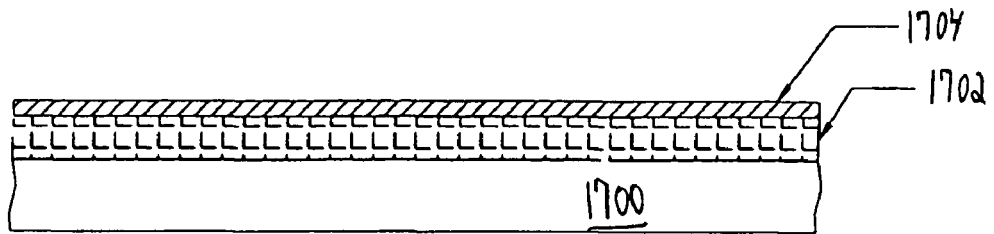
FIGS. 17a to 17h are schematic diagrams that show cross-sectional views of the exemplary processing steps for forming the connector of FIG. 9a according to one implementation of the present invention.
Figure 17B:
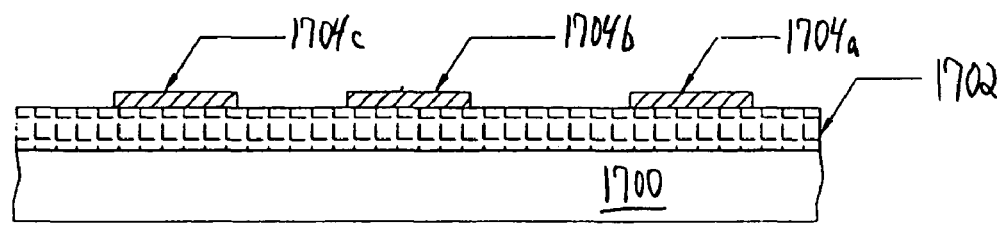

FIGS. 17a to 17h illustrate the processing steps for forming the connector 900 of FIG. 9a, according to one configuration of the present invention. Referring to FIG. 17a, a substrate 1700 on which the contact elements are to be located is provided. The substrate 1700 can be a silicon wafer or ceramic wafer with previously defined circuits, for example, and may include a dielectric layer formed thereon (not shown in FIG. 17a). The dielectric layer, of SOS, SOG, BPTEOS, or TEOS for example, can be formed on the substrate 1700 for isolating the contact elements from the substrate 1700. Then, a support layer 1702 is formed on the substrate 1700. The support layer 1702 can be a deposited dielectric layer, such as an oxide or nitride layer, a spin-on dielectric, a polymer, or any other suitable etchable material. The support layer 1702 can be deposited by a number of different processes, including chemical vapor deposition (CVD), plasma vapor deposition (PVD), a spin-on process, or when the substrate 1700 is not covered by a dielectric layer or a conductive adhesive layer, the support layer 1702 can be grown using an oxidation process commonly used in semiconductor manufacturing.

After the support layer 1702 is deposited, a mask layer 1704 is formed on the top surface of the support layer 1702. The mask layer 1704 is used in conjunction with a conventional lithography process to define a pattern on the support layer 1702 using the mask layer 1704. After the mask layer is printed and developed (FIG. 17b), a mask pattern, including regions 1704a to 1704c, is formed on the surface of the support layer 1702 defining areas of the support layer 1702 to be protected from subsequent etching.

Figure 17C:
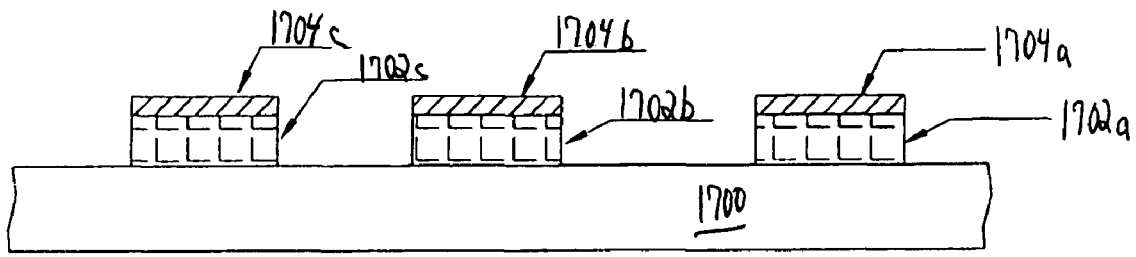
Figure 17D:
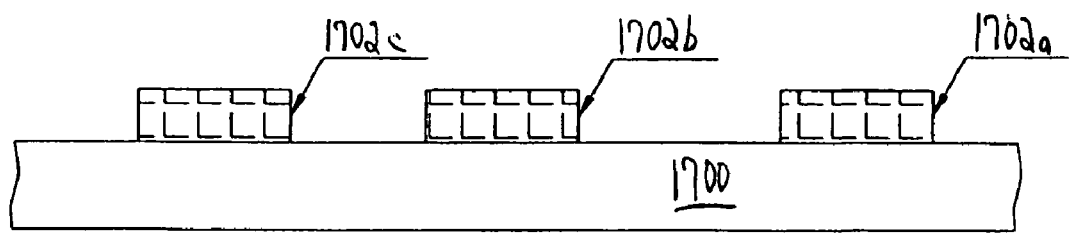

Referring to FIG. 17c, an anisotropic etching process is performed using regions 1704a to 1704c as a mask. As a result of the anisotropic etching process, the portions of the support layer 1702 not covered by a patterned mask layer is removed. Accordingly, support regions 1702a to 1702c are formed. The mask pattern including regions 1704a to 1704c is subsequently removed to expose the support regions (FIG. 17d).

Figure 17E:
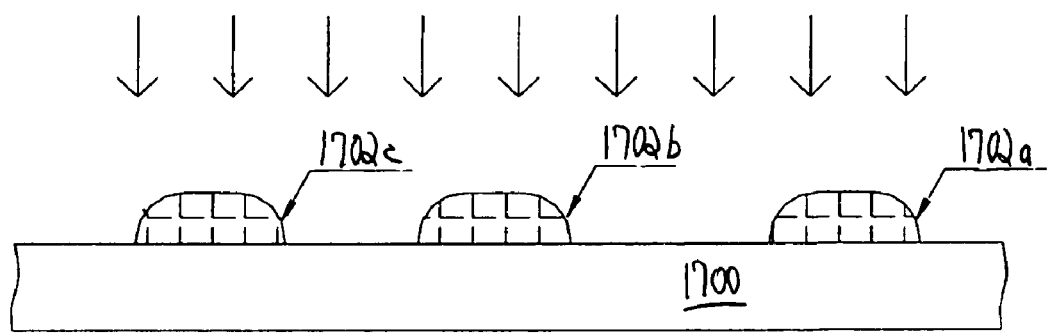

The support regions 1702a to 1702c are then subjected to an isotropic etching process. An isotropic etching process removes material under etch in the vertical and horizontal directions at substantially the same etch rate. Thus, as a result of the isotropic etching, the top corners of the support regions 1702a to 1702c are rounded off as shown in FIG. 17e. In one configuration, the isotropic etching process is a plasma etching process using $SF_6$, $CHF_3$, $CF_4$, or other well known chemistries commonly used for etching dielectric materials. In an alternate configuration, the isotropic etching process is a wet etch process, such as a wet etch process using a buffered oxide etch (BOE).

Figure 17F:
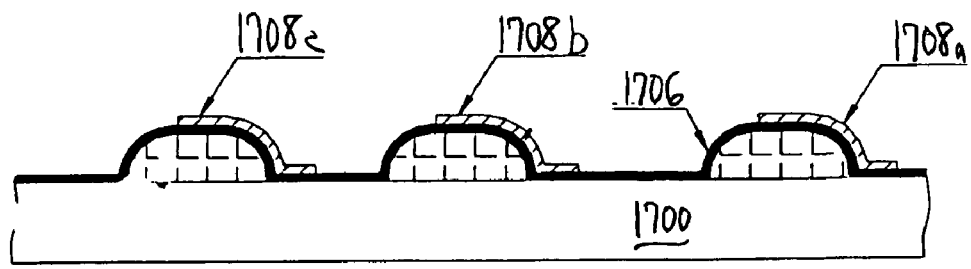

Then, referring to FIG. 17f, a metal layer 1706 is formed on the surface of the substrate 1700 and the surface of support regions 1702a to 1702c. The metal layer 1706 can be a copper layer, a copper alloy (Cu-alloy) layer, or a multilayer metal deposition such as titanium-coated with copper-nickel-gold (Cu/Ni/Au). In a preferred configuration, the contact elements are formed using a small-grained copper beryllium (CuBe) alloy, and are then plated with electroless nickel-gold (Ni/Au) to provide a non-oxidizing surface. The metal layer 1706 can be deposited by a CVD process, electro plating, sputtering, PVD, or other conventional metal film deposition techniques. A mask layer is deposited and patterned into mask regions 1708a to 1708c using a conventional lithography process. The mask regions 1708a to 1708c define areas of the metal layer 1706 to be protected from subsequent etching.

Figure 17G:
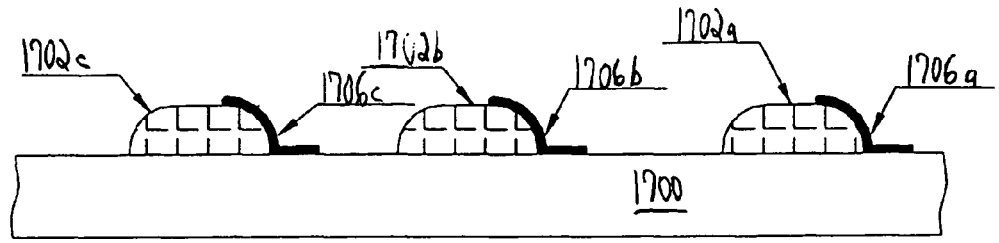
Figure 17H:
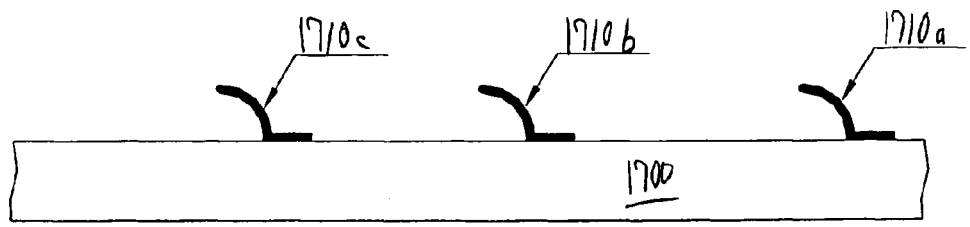

The structure in FIG. 17f is then subjected to an etching process for removing the portions of the metal layer not covered by mask regions 1708a to 1708c. As a result, metal portions 1706a to 1706c are formed as shown in FIG. 17g. Each of the metal portions 1706a to 1706c includes a base portion formed on the substrate 1700 and a curved spring portion formed on a respective support region (1702a to 1702c). Accordingly, the curved spring portion of each metal portion assumes the shape of the underlying support region, projecting above the surface of the substrate 1700.

To complete the connector, the support regions 1702a to 1702c are removed (FIG. 17h), such as by using a wet etch, an anisotropic plasma etch, or other etch process. If the support layer is formed using an oxide layer, a buffered oxide etchant can be used to remove the support regions. As a result, free standing contact elements 1710a to 1710c are formed on the substrate 1700.

Variations in the above processing steps are possible to fabricate the connector of the present invention. For example, the chemistry and etch condition of the isotropic etching process can be tailored to provide a desired shape in the support regions, so that the contact elements have a desired curvature. Through the use of semiconductor processing techniques, a connector can be fabricated with contact elements having a variety of properties. For example, a first group of contact elements can be formed with a first pitch, while a second group of contact elements can be formed with a second pitch that is greater or smaller than the first pitch. Other variations in the electrical and mechanical properties of the contact element are possible.

Figure 18A:
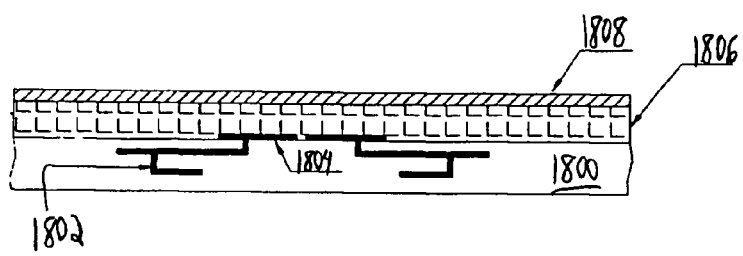
FIGS. 18a and 18b are schematic diagrams that show cross-sectional views of the exemplary processing steps for forming a connector according to an alternate implementation of the present invention.
Figure 18B:
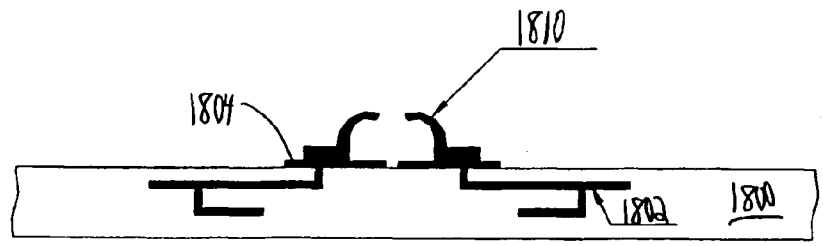

FIGS. 18a and 18b illustrate the first and last processing steps for forming a circuitized connector similar to the connector 1400 of FIG. 14a, according to an alternate configuration of the present invention. Referring to FIG. 18a, a substrate 1800 including predefined circuitry 1802 is provided. The predefined circuitry 1802 can include interconnected metal layers or other electrical devices, such as capacitors, resistors, transistors, or inductors, which are typically formed in the substrate 1800. A top metal portion 1804 is formed on the top surface of the substrate 1800 to be connected to the contact element to be formed. A support layer 1806 and a mask layer 1808 are formed on the top surface of the substrate 1800.

A process similar to that described above in connection with FIGS. 17b to 17g is used to form a contact element 1810 (FIG. 18b). As thus formed, the contact element 1810 is electrically connected to the circuit 1802. In this manner, additional functionality can be provided by the connector of the present invention. For example, the circuit 1802 can be formed to electrically connect certain contact elements together. The circuit 1802 can also be used to connect certain contact elements to electrical devices such as a capacitor or an inductor formed in or on the substrate 1800.

Fabricating the contact element 1810 as part of an integrated circuit manufacturing process provides further advantages. Specifically, a continuous electrical path is formed between the contact element 1810 and the underlying circuit 1802. There is no metal discontinuity or impedance mismatch between the contact element and the associated circuit. In some prior art connectors, a gold bond wire is used to form the contact element. However, such a structure results in gross material and cross-sectional discontinuities and impedance mismatch at the interface between the contact element and the underlying metal connections, resulting in undesirable electrical characteristics and poor high frequency operations.

According to another aspect of the present invention, a connector is provided with contact elements having different operating properties. That is, the connector can include heterogeneous contact elements where the operating properties of the contact elements can be selected to meet requirements in the desired application. The operating properties of a contact element refer to the electrical, mechanical, and reliability properties of the contact element. By incorporating contact elements with different electrical and/or mechanical properties, a connector can be made to meet all of the stringent electrical, mechanical, and reliability requirements for high-performance interconnect applications.

According to alternate configurations of the present invention, the electrical properties can be specifically engineered for a contact element or a set of contact elements to achieve certain desired operational characteristics. For instance, the DC resistance, the impedance, the inductance, and the current carrying capacity of each contact element can be varied. Thus, a group of contact elements can be engineered to have lower resistance or to have low inductance. The contact elements can also be engineered to display no or minimal performance degradation after environmental stresses such as thermal cycling, thermal shock and vibration, corrosion testing, and humidity testing. The contact elements can also be engineered to meet other reliability requirements defined by industry standards, such as those defined by the Electronics Industry Alliance (EIA).

The mechanical and electrical properties of the contact elements can be modified by changing the following design parameters. First, the thickness of the spring portion of the contact element can be selected to give a desired contact force. For example, a thickness of about 30 microns typically gives a low contact force on the order of 10 grams or less, while a flange thickness of 40 microns gives a higher contact force of 20 grams for the same displacement. The width, length, and shape of the spring portion can also be selected to give the desired contact force.

Second, the number of spring portions included in a contact element can be selected to achieve the desired contact force, the desired current carrying capacity, and the desired contact resistance. For example, doubling the number of spring portions roughly doubles the contact force and current carrying capacity, while roughly decreasing the contact resistance by a factor of two.

Third, specific metal composition and treatment can be selected to obtain the desired elasticity and conductivity characteristics. For example, copper alloys, such as beryllium copper, can be used to provide a good tradeoff between mechanical elasticity and electrical conductivity. Alternately, metal multilayers can be used to provide both excellent mechanical and electrical properties. In one configuration, a contact element is formed using titanium (Ti) coated with copper (Cu), then with nickel (Ni), and finally with gold (Au) to form a Ti/Cu/Ni/Au multilayer. The Ti provides elasticity and high mechanical durability, the Cu provides conductivity, and the Ni and Au layers provide corrosion resistance. Finally, different metal deposition techniques, such as plating or sputtering, and different metal treatment techniques, such as alloying, annealing, and other metallurgical techniques can be used to engineer specific desired properties for the contact elements.

Fourth, the shape of the spring portion can be designed to give certain electrical and mechanical properties. The height of the spring portion, or the amount of projection from the base portion, can also be varied to give the desired electrical and mechanical properties.

FIGS. 19a–19d are flowcharts of a method 1900 for forming contact elements in accordance with an alternate configuration of the present invention. FIGS. 20–23b will be discussed in the context of the discussion of the method 1900. The method 1900 also relates to batch fabrication of the contact elements using masking, etching, forming, and lamination techniques. The method 1900 produces a plurality of highly engineered electrical contacts, capable of use in a separable connector such as in an interposer, or the contacts can be directly integrated into a substrate as a continuous trace that then functions as a permanent onboard connector. However, rather than using additional masking and etching steps to form the three dimensional spring portions, they are created in flat arrays and are then formed into three dimensional shapes.

First, a base spring material for the sheet of contacts is selected, such as beryllium copper (Be—Cu), spring steel, phosphorous bronze, or any other material with suitable mechanical properties (step 1902). The proper selection of material enables the contact elements to be engineered to have the desired mechanical and electrical properties. One factor in the selection of the base material is the working range of the material. Working range is the range of displacement over which the contact element meets both contact force (load) and contact resistance specifications. For example, assume that the desired contact resistance is less than 20 milliohms and the maximum allowed contact load is 40 grams. If the contact element reaches a resistance range of less than 20 milliohms at 10 grams of load and then is carried over to the maximum load of 40 grams for the beam member, while maintaining a resistance of less than 20 milliohms, then the distance over which the contact element has traveled between 10 grams and 40 grams of load would be the working range of the contact.

The sheet can be heat treated prior to subsequent processing (step 1904). Whether the sheet is heated at this point in the process is determined by the type of material selected for the sheet. The heating is performed to move the material from a half-hard state into a hard state or highly-tensile state that provides desired mechanical properties for forming the contacts.

A contact element is designed and is copied into an array form, for use in batch processing (step 1906). The number of contacts in an array is a design choice, and can vary depending on the requirements for the connector. The arrays are repeated into a panel format, analogous to chips or die in a semiconductor wafer, resulting in a scalable design that lends itself to batch processing. After the contact design has been completed (usually in a CAD drawing environment), the design is ported to a Gerber format, which is a translator that enables the design to be ported to a fabrication facility to produce the master slides or film to be used in the subsequent steps.

The panel format can have anywhere between one and a large number of contacts, because the use of lithography permits placing a high density of contacts onto a panel. This high density of contacts provides an advantage over existing methods in that a batch process can be used to singulate the contacts, as opposed to stamping and forming individual contacts. The method 1900 permits a large number of contacts to be patterned, developed, and etched at once.

Figure 20:
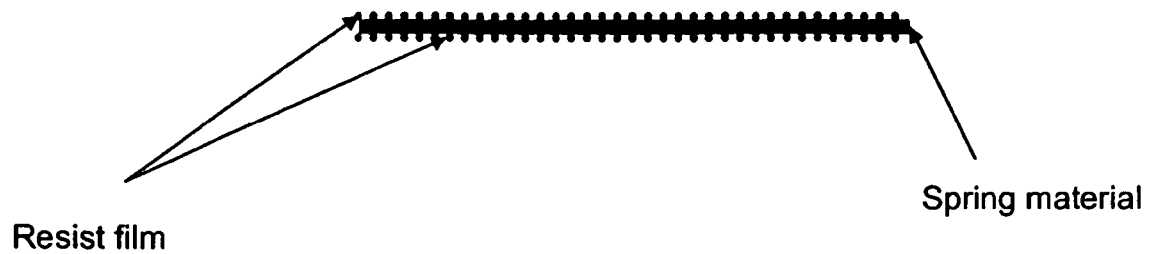
FIG. 20 is a schematic diagram of a cross-sectional view of an exemplary resist film applied to a sheet of spring material in accordance with the method shown in FIGS. 19a–19d.

A lithographically sensitive resist film is then applied to both sides of the sheet (step 1908 and FIG. 20). A dry film can be used for larger feature sizes ranging from one to 20 mils, and a liquid resist can be used for feature sizes less than one mil.

Figure 21:
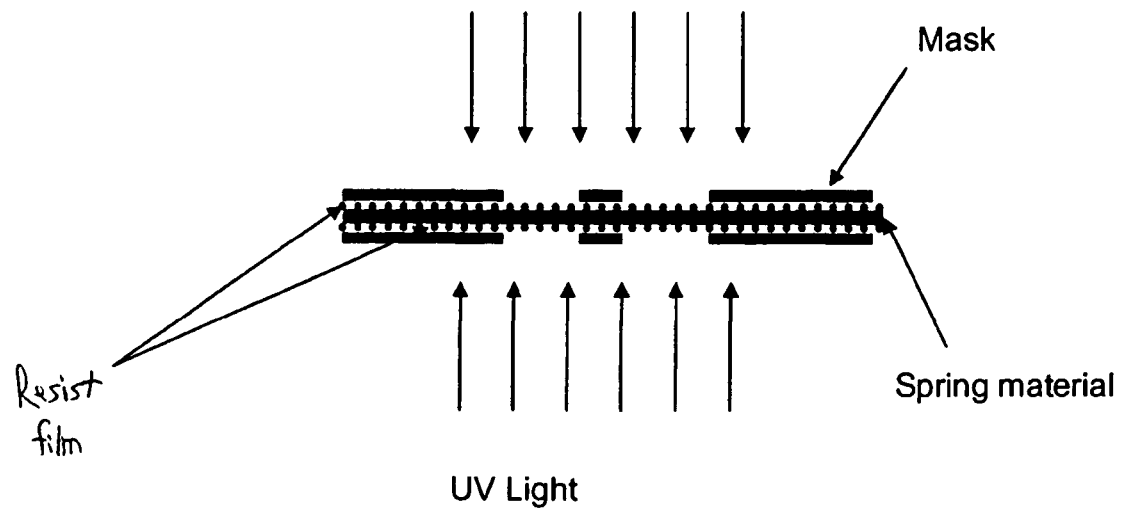
FIG. 21 is a schematic diagram of a cross-sectional view of UV light being applied to the resist film, in accordance with the method shown in FIGS. 19a–19d.
Figure 22:
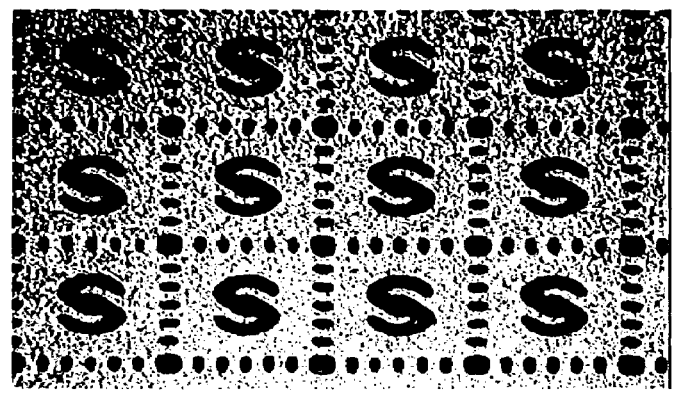
FIG. 22 is a schematic diagram of a plan view of an exemplary sheet of contact elements formed in accordance with the method shown in FIGS. 19a–19d.

Using the artwork defined in step 1906, both the top and bottom of the sheet are exposed to ultraviolet (UV) light and then developed to define contact features in the resist (step 1910 and FIG. 21). Portions that are intended to be etched are left unprotected by the mask. Using a lithographic process to define the contact elements enables the printing of lines with a fine resolution, similar to that found in semiconductor manufacturing.

The sheet is then etched in a solution specifically selected for the material being used (step 1912). Each particular material that can be selected for the sheet typically has a specific etch chemistry associated with it to provide the best etch characteristics, such as etch rate (i.e., how well and how fast the solution performs the etch). This is an important consideration in the context of throughputs. The etchant selected also effects other characteristics like the sidewall profile, or the straightness of a feature as seen in cross section. In the method 1900, chemicals common in the industry are used, such as cupric chloride, ferric chloride, and sulfuric hydroxide. Once etched, the protective layer of resist is removed in a stripping process, leaving the etched features in the sheet (step 1914 and FIG. 22).

A batch forming tool is designed, based upon the artwork defined in step 1906 (step 1916). In one configuration, the batch forming tool includes a plurality of ball bearings arranged, into an array format, preferably by being set into an array of openings in a support surface. The ball bearings can be of different sizes, to apply different forces to the contacts, thereby imparting different mechanical characteristics to contacts on the same panel. The curvature of the ball bearings is used to push the flanges away from the plane of the sheet. The flanges of the contacts are then formed in all three axes by applying the forming tool to the sheet, to produce the desired contact elements in a batch process (step 1918), as discussed in more detail with reference to FIGS. 24–30 below.

The sheet can be heat treated to relieve stress caused by the forming process (step 1920). As with step 1904, the heating step 1920 is optional, and is dependent upon the material selected for the sheet. Based upon the material and the size of the contacts to be defined on the sheet, heating may be performed to obtain the physical properties desired for optimal forming conditions.

The sheet is then surface treated to enhance adhesion properties for a subsequent lamination process (step 1922). If there is inadequate adhesion, there is a propensity for the sheet to separate from a substrate or delaminate. Several methods for performing the surface treating can be used, including micro etching and a black oxide process. The micro etching is used to pit the surface of the sheet, effectively creating a greater surface area (by making the surface rough and cratered) to promote better adhesion. However, if the micro etching is not properly controlled, it can lead to damage on the sheet.

The black oxide process is a replacement process involving a self-limiting reaction in which an oxide is grown on the surface of the sheet. In this reaction, the oxygen diffuses only through a set thickness, thereby limiting the amount of oxide grown. The oxide has a rough surface in the form of bumps, which helps to promote adhesion. Either the micro etching or the black oxide processes can be used for the surface treatment step, and a preference for one process over the other is a design choice.

Prior to pressing, a low flow adhesion material and dielectric core are processed with relief depressions or holes located beneath flange elements (step 1924). This is intended to prevent excess flow of material up on the flange during the lamination process. Should this flow happen, the contact properties would be altered, causing the contact element to be unsuitable for electrical and mechanical use.

Figure 23A:
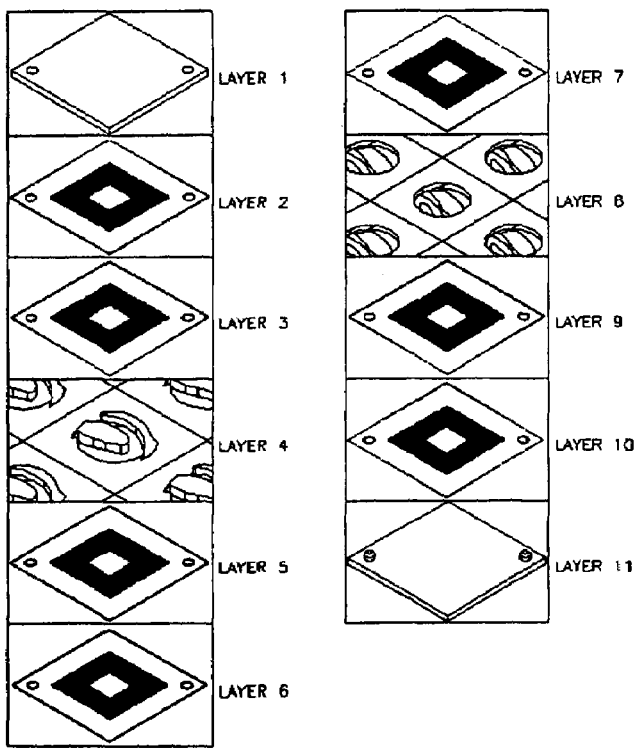
FIG. 23a is a schematic diagram of a view of each layer of an exemplary stack up used in one of the steps of the method shown in FIGS. 19a–19d.
Figure 23B:
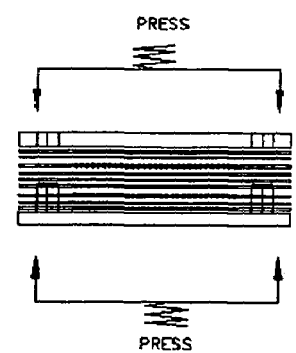

The following list is a typical stack up generated for lamination pressing (step 1926). This arrangement could be altered to have the contact elements inserted as internal layers. FIG. 23a shows each layer of the stack up.

a. Layer 1 is a top press plate material b. Layer 2 is a spacer material with a relief hole over the spring contact element c. Layer 3 is a release material with a relief hole over the spring contact d. Layer 4 is a top sheet of formed contact sheets e. Layer 5 is an adhesion material with a relief hole beneath the spring contact f. Layer 6 is a core dielectric with relief holes under and above the spring contact g. Layer 7 is an adhesion material with a relief hole above the spring contact h. Layer 8 is a bottom sheet of formed contact elements i. Layer 9 is a release material with a relief hole below the spring contact j. Layer 10 is a spacer material with a relief hole below the spring contact element k. Layer 11 is a bottom press plate material The stack up is pressed under temperature conditions optimized for desired adhesions and flow conditions for the adhesion material (step 1928 and FIG. 23b). During this operation, the top and bottom contact sheets are bonded to a core dielectric material. After a cool down period, the stack up is removed from the press plates, leaving a panel comprised of Layers 4–8 (step 1930).

The panel surfaces and openings are then plated to electrically connect the top and bottom flanges (step 1932). This step takes the top flange and electrically connects it to the bottom flange by a plating process known as an electroless process. The process effectively deposits a conductive material on the top surface, into the through hole to connect both sheets of contact elements, and then onto the sheet on the other side of the substrate. The plating process creates a route for an electrical current to travel from one side of the board to the other.

Next, a photosensitive resist film is applied to both sides of the panel (step 1934). A pattern is exposed and developed to define the individual contact elements (step 1936). A determination is then made as to the contact finish type, either hard gold or soft gold (step 1938). Hard gold is used in specific applications where the numbers of insertions required are high, such as a test socket. Hard gold itself has impurities that cause the gold to be more durable. Soft gold is a pure gold, so it effectively has no impurities, and is typically used in the PCB or networking space, where the number of insertions is fairly low. For example, a package to board socket used in a PC (soft gold) will typically see on the order of one to 20 insertions, whereas other technology using hard gold will see a number of insertions between 10 and 1,000,000.

If the contact finish type is a hard gold, then a partial etching is performed to almost singulate the contact elements (step 1940). The resist film is removed via a stripping process (step 1942). A new layer of resist is applied, covering both sides of the panel (step 1944). The previously etched areas are exposed and developed (step 1946). The panel is then submitted for electrolytic Cu/Ni/Au plating via a hard gold process (step 1948).

The resist is removed to expose previous partially etched scribe lines (step 1950). The entire panel is etched using electrolytic Ni/Au as a hard mask to complete singulation of the contact array (step 1952). Final interposer outlines are routed out of the panel to separate the panel into individual connector arrays (step 1954), and the method terminates (step 1956).

If a soft gold finish is used (step 1938), then etching is used to completely singulate the contact elements (step 1960). The resist film is removed via a stripping process (step 1962). Electroless Ni/Au, also known as a soft gold, is plated onto the panel to complete the contact elements (step 1964). Final interposer outlines are routed out of the panel to separate the panel into individual connector arrays (step 1954), and the method terminates (step 1956).

The soft gold finishing process singulates the contacts prior to plating. Ni/Au will plate only on metal surfaces, and provides a sealing mechanism for the contact element his helps to prevent potential corrosive activity that could occur over the system life of the contact, since gold is virtually inert. Singulation prior to plating is a means to isolate or encapsulate the copper contact with another metal, resulting in cleaner imaging and a cleaner contact, which has a low propensity for shorting.

Figure 24:
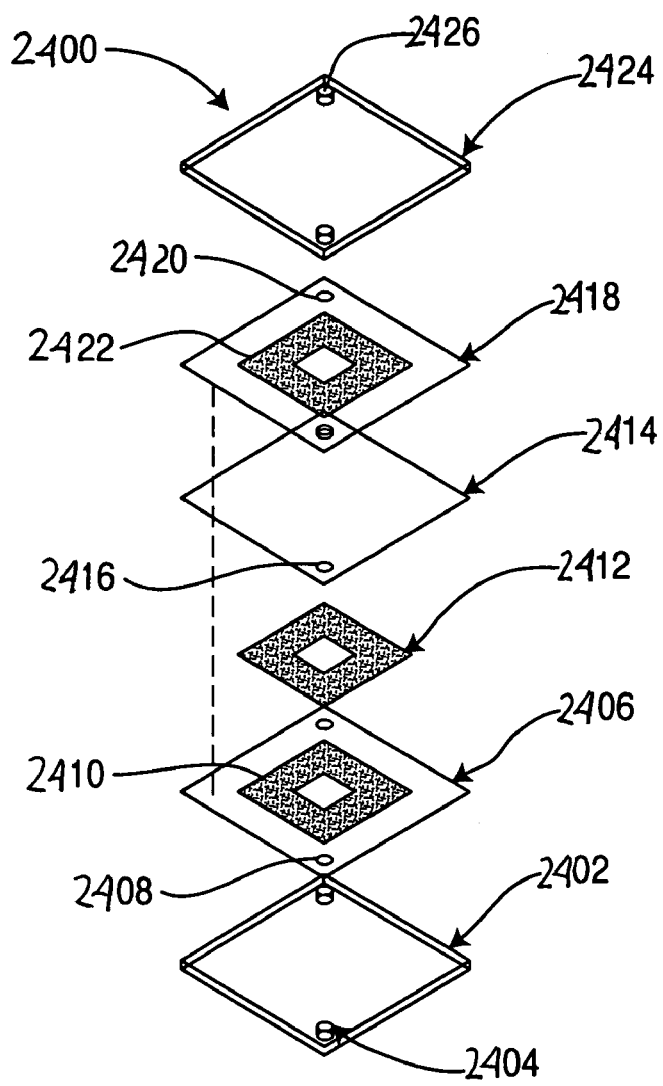
FIG. 24 is a schematic diagram of an exploded perspective view of an exemplary stack-up in accordance with one configuration of the present invention.
Figure 25:
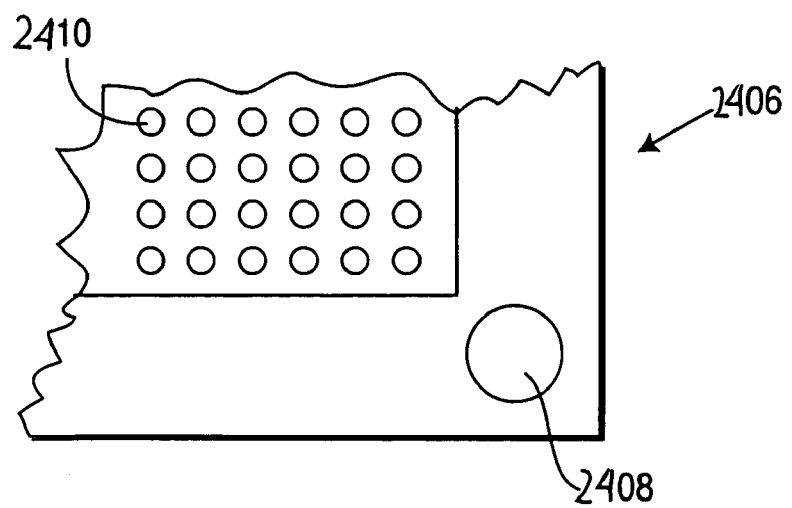
FIG. 25 is a schematic diagram of an enlarged partial top plan view of an exemplary spacer layer used in the stack-up shown in FIG. 1.

FIG. 24 shows an exemplary stack-up 2400 that can be used in step 1918 for batch forming spring elements in three dimensions in accordance with one configuration of the present invention. Stack-up 2400 has a bottom press plate 2402 as its bottom layer. Bottom press plate 2402 preferably includes at least two dowel pins 2404 or other aligning means such as reference holes, edges, or the like, for aligning the elements of stack-up 2400. The material used for bottom press plate 2402 can be any material with sufficient rigidity to support the force used for compressing the stack-up without deforming the press plate 2402, for example, steel or aluminum. While stack-up 2400 is shown utilizing two dowel pins 2404, any number of dowel pins can be used.

A bottom spacer layer 2406 (shown in partial top plan view in FIG. 25) is positioned above bottom press plate 2402. In one configuration, bottom spacer layer 106 is made of a softer material than bottom press plate 2402, for example, metal or plastic. It is noted that layer 2406 could alternatively be made of a material similar to bottom press plate 2402. Layer 2406 has positioning holes 2408, or other suitable means as discussed above, to align layer 2406 with bottom press plate 2402. Layer 2406 also has a plurality of holes 2410. Each of holes 2410 is sized and shaped to hold a configurable die, for example, ball bearings 2412, depicted in the enlarged view of FIG. 26. The term configurable die, as used herein, refers to elements that can be used to form or impart a shape in another structure, such as a deformable sheet. In addition to spherical ball bearings, configurable die could also be conical, pyramidal or other shapes.

While the exemplary configuration shown in FIGS. 24–27 utilizes through holes 2410, openings that extend partially or all the way through layer 2406 can be provided. In one configuration of the present invention, holes 2410 and configurable die 2412 are formed in precise positions using photolithographic mask and etch technology in order to form an array that exactly matches a particular contact arrangement, for example a contact arrangement of a device to be contacted by the finished spring element sheet. This arrangement can be done inexpensively at micron accuracy, with very fast turn-around to accommodate various contact patterns.

Figure 26:
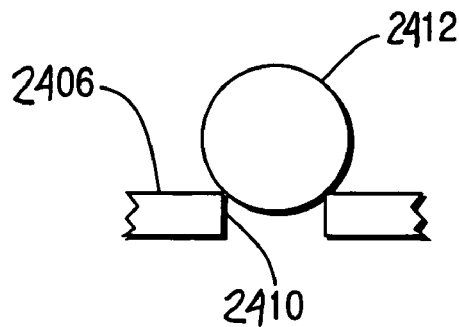
FIGS. 26 and 27 are schematic diagrams of cross-sectional views of an exemplary ball bearing configured die inserted into a spacer layer used in the stack-up shown in FIG. 1.
Figure 27:
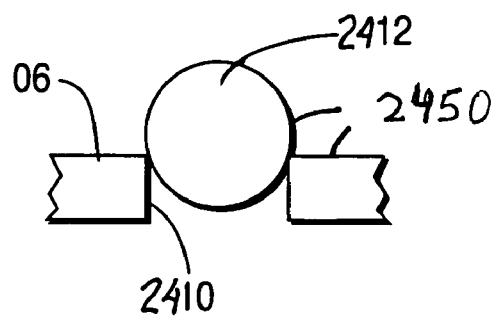
Figure 29:
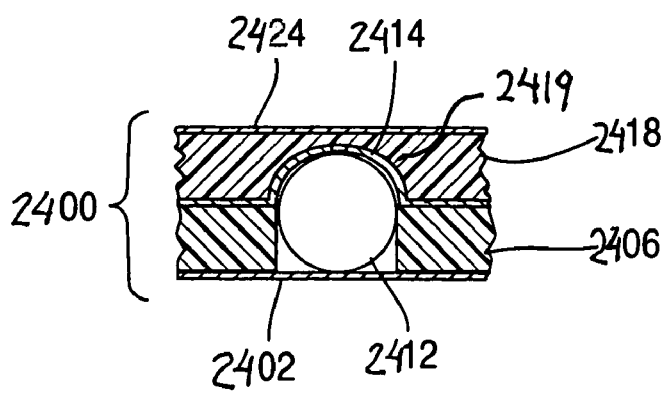
FIG. 29 is a schematic diagram of a cross-sectional side view of an alternate configuration of a spring element sheet after pressing.

Ball bearings 2412 or other configurable die are placed into holes 2410 by manual or mechanical means according to a desired pattern to form the spring elements or dome features that may then later be patterned and etched to form spring elements. Ball bearings 2412 can have a slight interference fit so that they are pressed and held in position. As shown in FIGS. 26 and 27, the height that the bearings protrude can be controlled by the hole diameter. Ball bearings 2412 can be inserted up to their equator or beyond for stability, as shown in FIG. 29. Holes 2410 are generally drilled slightly smaller than ball bearing 2412, e.g., 0.025 mm or smaller. By press fitting ball bearings 2412 into holes 2410, there is a slight elastic deformation of spacer layer 2406. This deformation applies a frictional force of spacer layer 2406 which helps keep ball bearing 2412 in place.

After one or more configurable die 2412, such as ball bearings, are inserted and press fit into holes 2410, spacer layer 2406 can retain the configurable die, such that the resulting spacer layer containing configurable die can operate as a die plate for shaping deformable sheets to form spring elements in the sheets. The resulting die plate contains three dimensional features corresponding in size and shape to the portions of individual configurable die protruding above the plane of spacer layer 2406, imparting a three dimensional surface, for example, surface 2450 as depicted in FIG. 27.

Thus, according to a predetermined design desired for the final three dimensional spring elements, the shape and size of features of surface 2450 can be tailored by changing the shape and size of configurable die inserted in spacer layer 2406. For example, a predetermined design may call for spring elements to have a shape of a circular arc as viewed in cross section, as illustrated for layer 2414 in FIG. 29. Accordingly, a spherical or cylindrical die could be used to impart such a design. In addition, if a design requires that a spring element protrude from a plane by a predetermined distance, the height that a configurable die protrudes above the planar surface portion of a die plate can be varied accordingly.

Ball bearings 2412 or other configurable die can be made of hardened tool steel or stainless steel and can vary in diameter depending upon the desired characteristics of the spring elements to be formed. Ball bearings 2412 could also be made of any other suitable material, such as AL 6061, AL 76075, chromium steel, or tungsten carbide. As an example, ball bearings 2412 can range in diameter from approximately 0.3 mm to approximately 127.0 mm. The depth of insertion of ball bearings 2412 into layer 2406 is limited by bottom press plate 2402. The depth of insertion of ball bearings 2412 (as shown in FIGS. 26 and 27) can also be varied to provide different spring characteristics to individual spring elements. Additionally, ball bearings 2412 or other configurable die of different sizes or shapes can be utilized to achieve different spring characteristics.

Figure 19A:
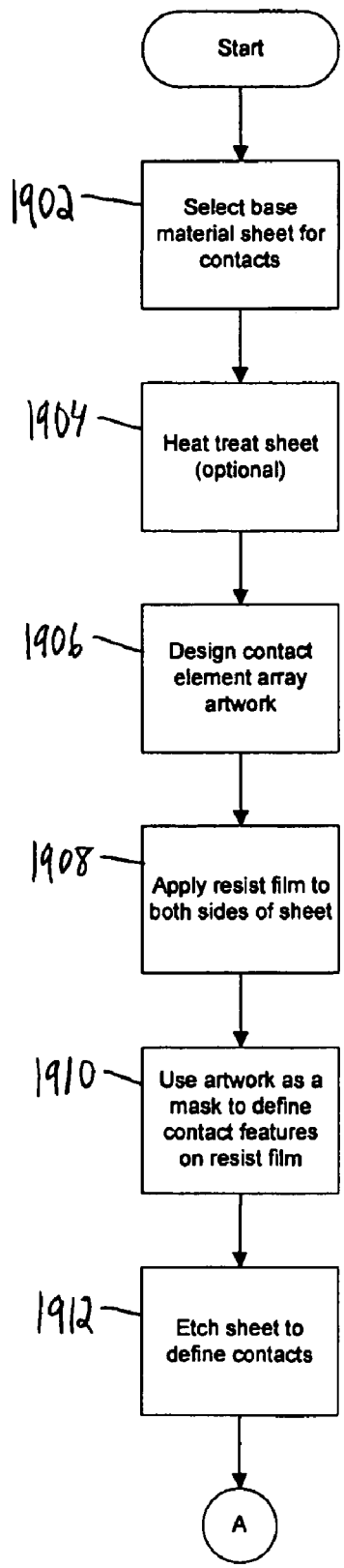
FIGS. 19a–19d are flowcharts showing the steps of an exemplary method for making a connector in accordance with an alternate implementation of the present invention.
Figure 19B:
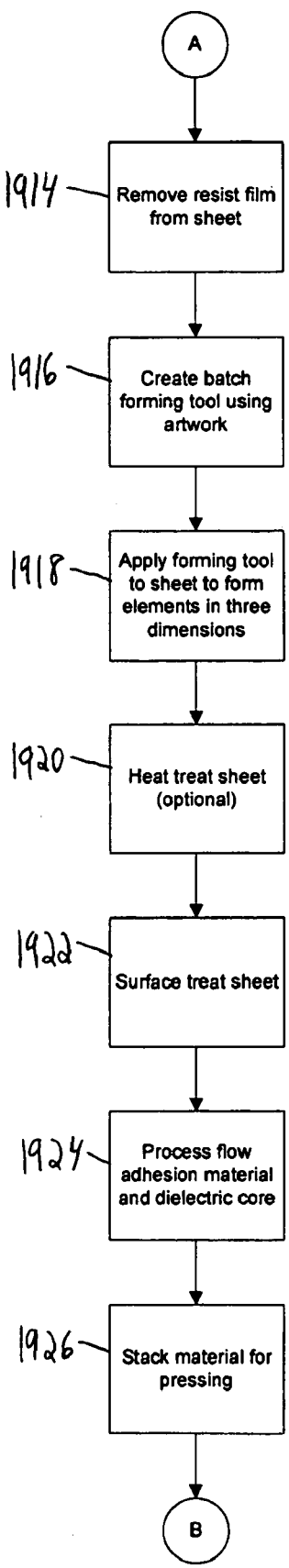
Figure 19C:
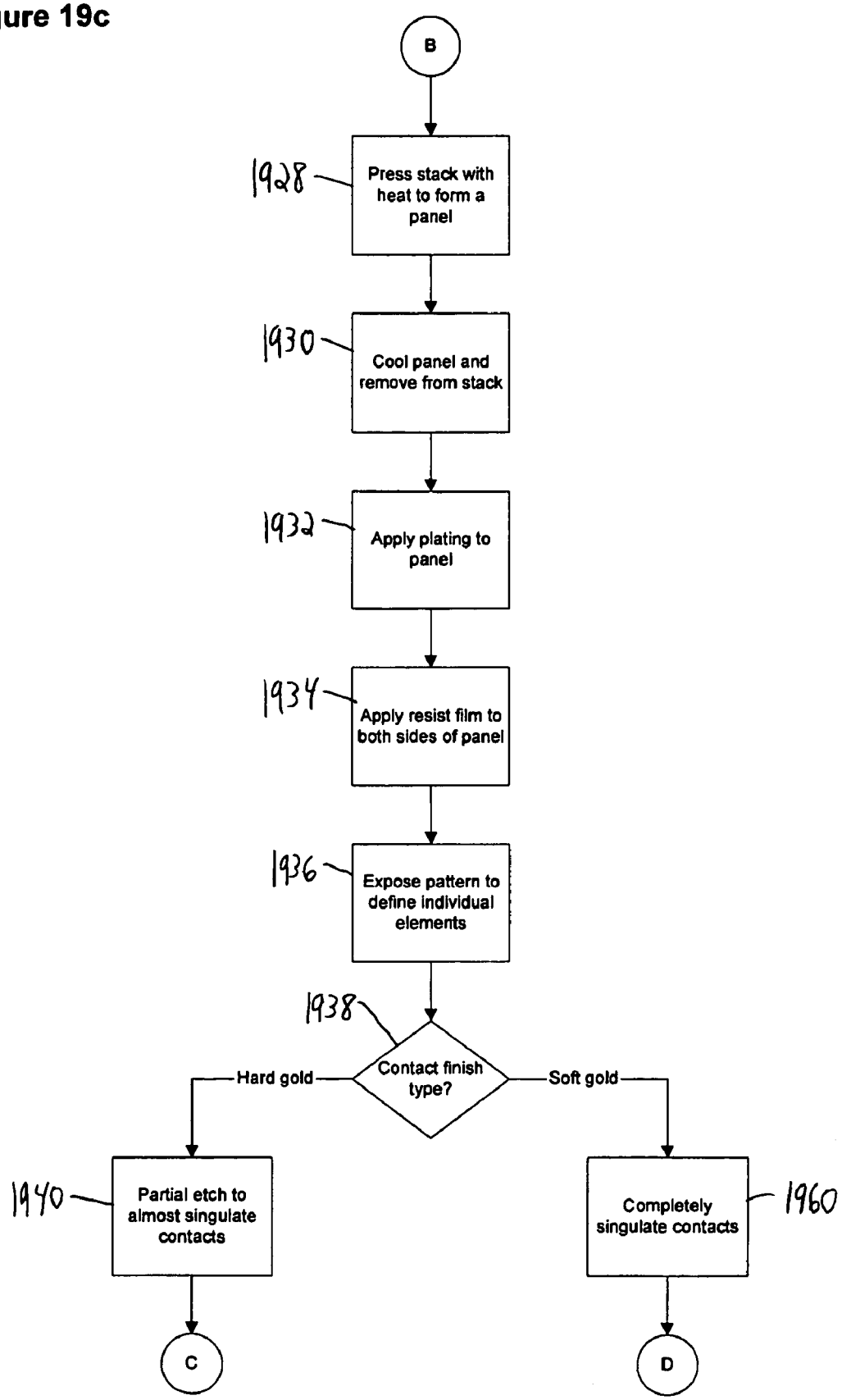
Figure 19D:
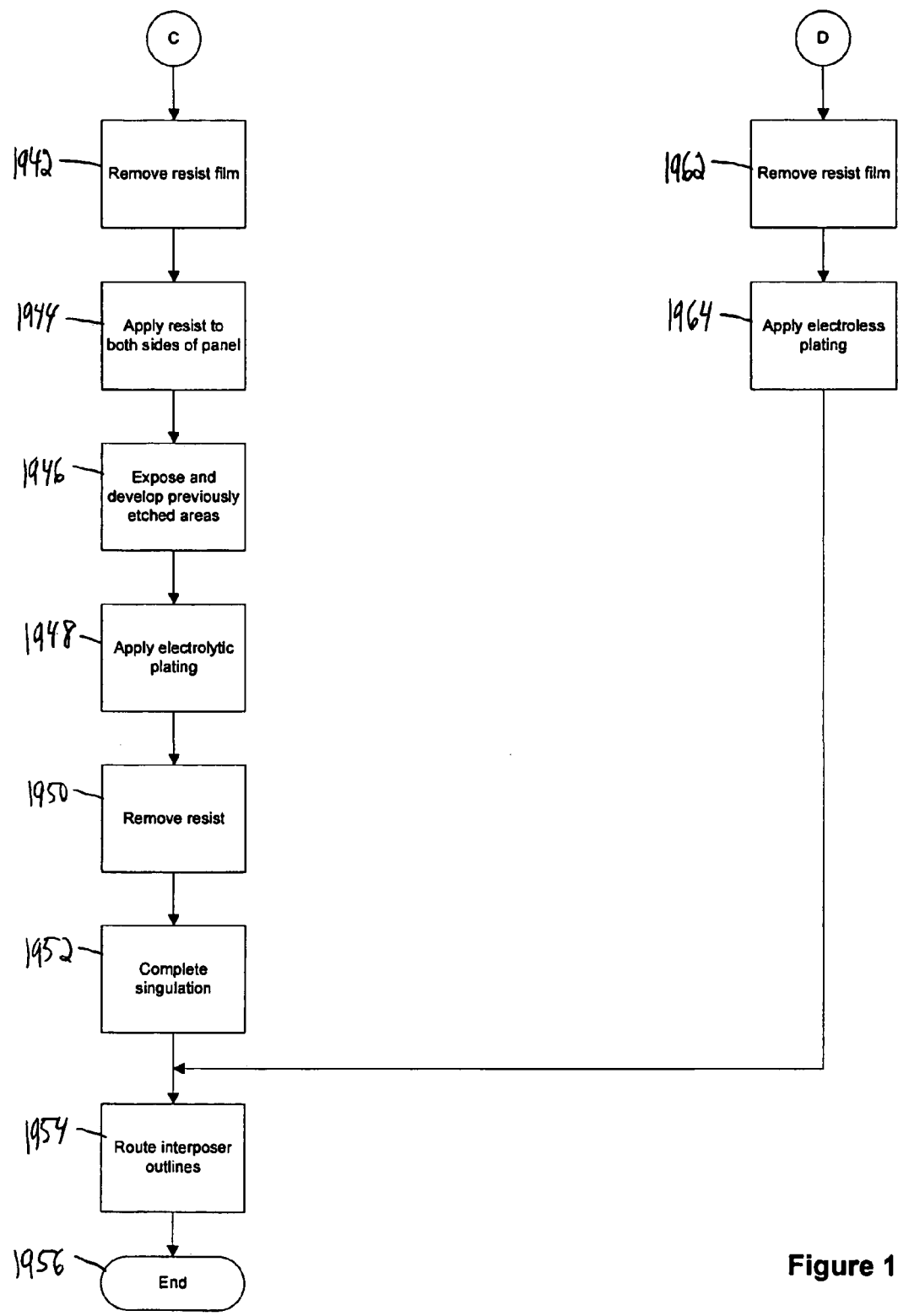
Figure 28:
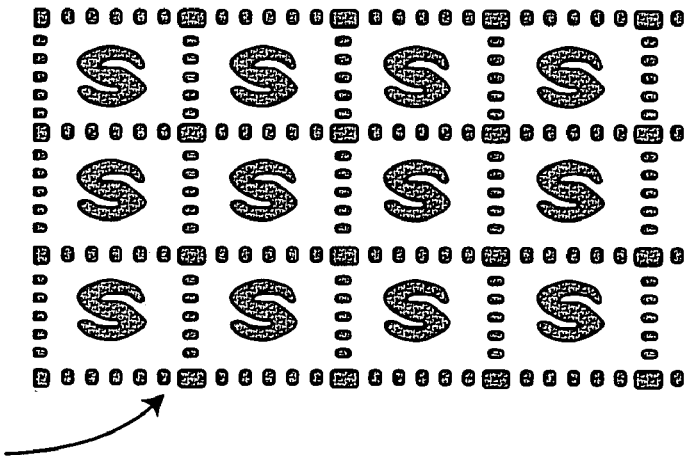
FIG. 28 is a schematic diagram of a top plan view of an exemplary

In one configuration, a spring element sheet 2414 having positioning holes 2416 for alignment with dowel pins 2404, or other alignment means, is placed on top of ball bearings 2412 or other configurable die. Sheet 2414 contains spring elements defined in two dimensions and can be formed by various methods, including etching or stamping. An example of a spring element sheet with the elements defined in two dimensions is shown in FIG. 28. Referring also to FIG. 19*b*, in this configuration, the forming tool of step 1918 thus comprises layers 2402, 2406, 2412, 2418 and 2424, which are applied to sheet 2414 to form three dimensional spring elements that are arranged, for example, in an array within sheet 2414.

Referring again to FIG. 25, the configurable die 2412 can be arranged in a two dimensional pattern in spacer layer 2406, such that the die positions in the resulting die plate correspond to the positions of at least some of the two dimensional spring elements arranged in spring sheet 2414, when the die plate (not shown) is brought into contact with spring sheet 2414. Thus, if a user determines that every other of the two dimensional spring elements (see FIG. 28) in spring sheet 2414 is to be formed into a three dimensional spring element, the pattern of configurable die 2412 placed within spacer layer 2406 is arranged accordingly. In this manner, the configurable die 2412 deform only the two dimensional spring elements that are desired to be formed into three dimensional spring elements. Configurations may readily change by adding or removing regions of die that result in a new form or size of contact."

In an alternative configuration shown in FIG. 30, a spring element sheet 2414' without predefined spring elements may be used. Spring element sheet 2414' is a plain spring element sheet having only positioning holes 2416 to align sheet 2424' to other layers. The present invention operates in the same manner, regardless of whether sheet 2414 or sheet 2414' is used, except as noted below. For discussion proposes only, further discussion shall only refer to sheet 2414, but is equally applicable to sheet 2414'.

As shown in FIG. 24, a top spacer layer 2418 is placed on top of sheet 2414. Top spacer layer 2418 has positioning holes 2420 for aligning layer 2418 with dowel pins 2404, or other alignment means as discussed above. Top spacer layer 2418 can also contain a plurality of openings 2422 that are complementary to configurable die 2412, through which the spring elements are formed. As used herein, the term "complementary" signifies that openings 2422 are substantially aligned with positions of configurable die 2412 when top spacer layer 2418 is brought into contact with spring sheet 2414. Thus, local deformations of spring sheet 2414 around configurable die 2412 can be accommodated substantially within openings 2422 when top spacer layer 2418 contacts spring sheet 2414 and deforms it over configurable die 2412.

Top spacer layer 2418 may be constructed of similar or different materials as bottom spacer layer 2406. Openings 2422 in layer 2418 could be smaller, the same size or larger than holes 2410 in bottom spacer layer 2406. In this manner, some control over the final shape of the spring elements can be achieved by changing the size of openings 2422. In addition, the thickness of top spacer layer 2418 can also help to determine the final height of the spring elements above the surface of the sheet 2414.

Alternatively, spacer layer 2418 is made of a compliant material (for example, silicon rubber) substantially conformable around configurable die 2412 in order to form the spring elements on the contact area of configurable die 2412, as shown in FIG. 29. Thus, layer 2418 can initially comprise a layer having uniform thickness that can conform to three dimensional shapes by deformation of surface 2419, as shown in FIG. 29.

Referring again to FIG. 24, in an alternate configuration, top spacer layer 2418 can be designed as a top spacer sheet having a plurality of openings into which configurable die are pressed at defined locations. In this manner, top spacer layer 2418 forms a second die plate (not shown) that can be used to form spring elements below the plane of sheet 2414. In this manner, when layer 2418 and layer 2406 are brought into contact with spring sheet 2414, spring elements can be formed both above and below the plane of spring sheet 2414. The pattern of configurable die in top spacer layer 2418 are arranged so that the positions of individual die do not correspond to the same planar positions of configurable die in bottom spacer sheet 2406. That is, any planar position of spring sheet 2414, such as positions of two dimensional spring elements, can be contacted by a configurable die in either top spacer layer 2418 or bottom spacer sheet 2406, both not both. Thus, every configurable die of each set of configurable die, either arranged in the top spacer or bottom spacer, corresponds to a unique spring element position in spring sheet 2414. Accordingly, when stack up 2400 is brought together, every two dimensional spring element to be formed into a three dimensional spring element is forced to protrude either above or below the plane of spring sheet 2414.

As shown in FIG. 24, a top press plate 2424 is placed on top of top spacer layer 2418. Top press plate 2424 has positioning holes 2426 for alignment with dowel pins 2404 or other alignment means. Top press plate 2424 is constructed of similar materials as bottom press plate 2402. After the elements of stack-up 2400 have been assembled and aligned, preferably using dowel pins 2404, pressure is applied to both top press plate 2424 and bottom press plate 2402. This pressure forces configurable die 2412 against the underside of sheet 2414, pushing the spring elements upward to form them in three dimensions, as shown in FIG. 29.

The amount of force required to form the spring elements depends upon the properties of the material being formed, and can be limited by the yield strength of the bottom press plate 2402 if desired. However, in view of the size and scale of the contact arms being formed, this is generally not an issue.

As noted above, in alternate configurations, where configurable die are pressed into top layer 2418, a result similar to that shown in FIG. 29 can be obtained, the difference being that the configurable die would press the sheet downward instead of upward. Accordingly, in alternative configurations, some spring elements of a spring sheet can be pushed upwards by configurable die positioned below the spring sheet, while others are pushed downward by configurable die positioned above the sheet.

Figure 30A:
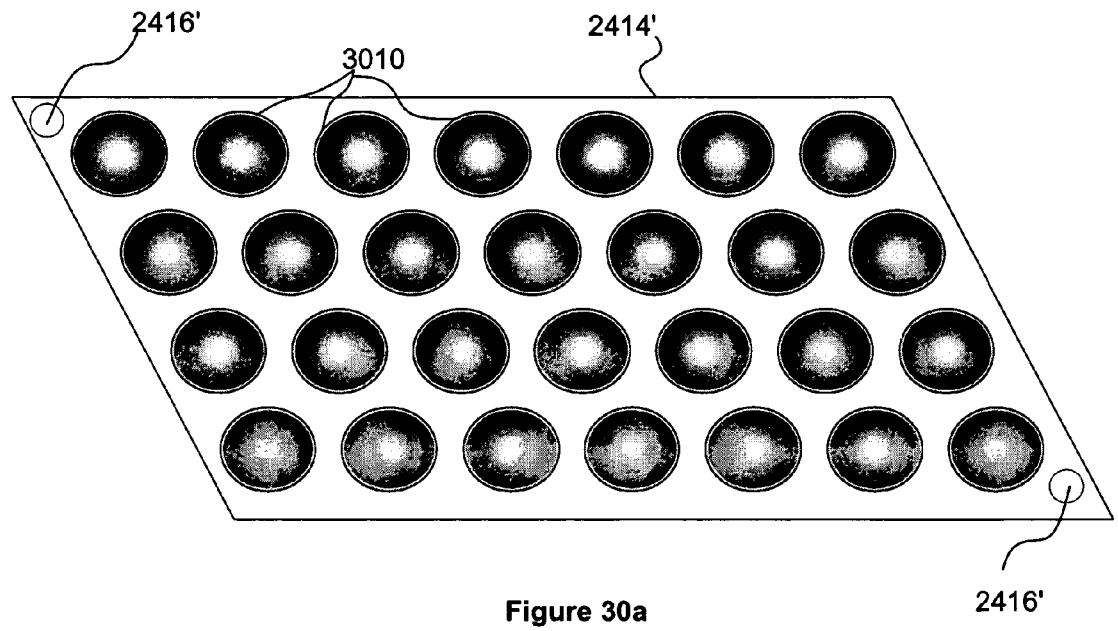
FIG. 30a is a schematic diagram that illustrates formation of three dimensional features in an unpatterned spring sheet, according to one configuration of the invention.

When the alternate configuration of spring element sheet 2414' is used, the pressure applied forces ball bearings 2412 against the underside of spring element sheet 2414', pushing spring element sheet 2414' upward to form three dimensional domes 3010, as shown in FIG. 30a. After pressing, domes 3010 can be patterned and etched to form three dimensional contact elements.

An electrical connector having a spring element formed by using a ball bearing in accordance with the present invention has unique characteristics. Pressing the spring element over the ball bearing causes the spring element to have a torsional force added to the spring force of the material, to provide additional spring characteristics. This results in unique physical configurations that provide the electrical connector with a better wiping action to an abutting electrical contact. The torsional force exists any time there is a twisting of the material; in the present case, the material is formed around a spherical ball bearing, causing it to be twisted around the surface of the sphere, thus supplying a torsional force. It is noted that arrangements of configurable die with surfaces having shapes other than the aforementioned spherical ball bearings are contemplated in the present invention. Accordingly, the degree and nature of forces imparted into electrical contacts formed over a configurable die of the present invention can be varied.

Figures 30B, 30C:
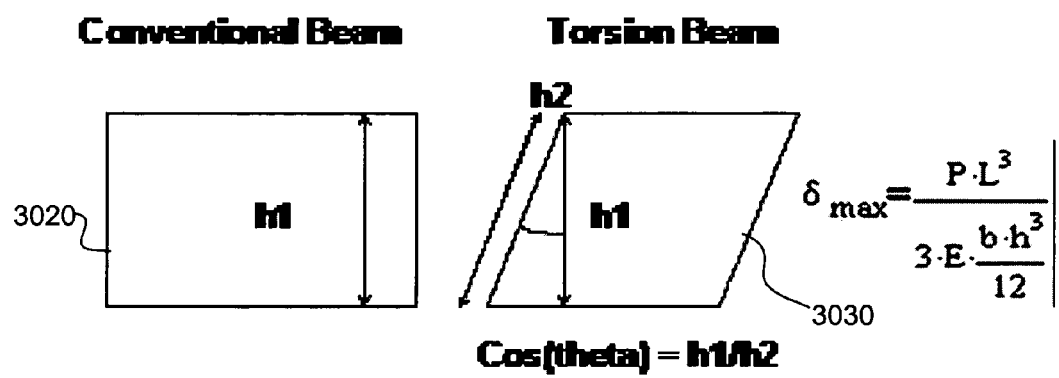
FIG. 30b illustrates a cross-sectional view of a standard beam spring element of an elastic contact, according to one configuration of the invention.
FIG. 30c illustrates a cross-sectional view of a torsional beam spring element of an elastic contact, according to one configuration of the invention.

FIG. 30b illustrates in cross-section a conventional cantilever beam spring element 3020 that can form a spring element of a contact, while FIG. 30c illustrates in cross-section a torsion beam spring element 3030 of a contact, according to configurations of the invention. The maximum deflection $\delta$ max in a cantilever beam of length L, width b, and height h, can be calculated according to the following formula: $\delta max = (PL^3)/(3Ebh^3/12)$ where P is the load applied to the beam and E is the elastic modulus of the beam. In a comparison of the beam cross sections of the standard beam of FIG. 30b and the torsion beam of FIG. 30c, it is readily apparent that, in solving for h2 (height of the torsion beam), that h1 (height of the standard beam) is less than h2. Thus, the resultant load P for a given $\delta$ max, can be significantly different from the standard un-torsional cantilever beam. Accordingly, by selecting an appropriate die element, such as a spherical ball bearing, for use in forming a three dimensional contact, one can impart more or less torsion into a formed three dimensional contact spring element such as a beam, so that the formed contact spring element can be engineered to meet certain desired mechanical responses.

In accordance with the principles of the present invention, a method 3100 for forming spring elements in three dimensions can also be derived, as shown in FIG. 31a. First, a base layer of ball bearings or other configurable die, is provided, with the ball bearings, for example, being arranged in a predetermined pattern corresponding to the location of the spring elements to be formed (step 3102). Next, a spring element sheet is placed on top of the ball bearings, the spring elements being defined in two dimensions and positioned over ball bearings on the base layer (step 3104). The spring element sheet is then pressed against the ball bearings, with the ball bearings contacting the underside of the sheet, thereby pressing the spring elements above the plane of the sheet and forming the spring elements in three dimensions (step 3106).

FIG. 31b illustrates an alternate method 3110 for forming spring elements from three dimensional structures (such as domes 3010 shown in FIG. 30). First, a configurable die, for example, a base layer of ball bearings is provided, with the ball bearings being arranged in a predetermined pattern corresponding to the location of the three dimensional domes to be formed (step 3114). Next, a plain spring sheet is placed on top of the configurable die (step 3116). The term "plain" refers to the fact that a plain spring sheet does not contain pre-patterned two dimensional spring elements before being pressed onto configurable die. Subsequently, the spring sheet is pressed against the configurable die, with the configurable die contacting the underside of the sheet, thereby pressing portions of the spring sheet above the plane of the sheet and forming surface three dimensional structures (also termed "three dimensional spring precursors"), for example, domes 3010 formed over ball bearings (step 3118). In step 3120, the spring sheet containing the three dimensional spring precursors, such as domes, is then patterned and etched into three dimensional spring contact elements. Thus, for example, individual domes can be patterned and etched through the entire spring sheet thickness to remove portions of the domes and form contacts having a structure, for example, similar to that of contact 1200 of FIG. 12.

While specific configurations of the present invention have been shown and described, many modifications and variations could be made by one skilled in the art without departing from the scope of the invention. The above description serves to illustrate and not limit the particular invention in any way.

Those skilled in the art will recognize that a connector according to the present invention could be used as an interposer, a PCB connector, or could be formed as an integral part of a PCB. The scalability of the present invention is not limited, and can be easily customized for production due to the lithographic techniques used and the simple tooling die used for forming the connector elements in three dimensions.

The foregoing disclosure of configurations of the present invention has been presented for purposes of illustration and description. It is not intended to be exhaustive or to limit the invention to the precise forms disclosed. Many variations and modifications of the configurations described herein will be apparent to one of ordinary skill in the art in light of the above disclosure. For example, the use of the terms "top" and "bottom" in referring to elements of stack up 2400 is for the purposes of clarity. Configurations in which top and bottom elements are reversed are within the scope of the invention. Additionally, configurations in which the layers of stack up 2400 are arranged as a horizontal stack are contemplated. The scope of the invention is to be defined only by the claims appended hereto, and by their equivalents.

Further, in describing representative configurations of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A system for batch forming three dimensional spring elements, comprising:
   a spring element sheet including two dimensional spring elements;
   a first spacer layer disposed on a first side of the spring element sheet;
   a die plate having three dimensional structures and disposed on a second side of the spring element sheet opposite the first side,
      the three dimensional structures contacting and forming the two dimensional spring elements into the three dimensional spring elements when the die plate and spacer layer are pressed against the spring element sheet;
   a first press plate disposed on a side of the first spacer layer opposite to the spring element sheet; and
   a second press plate disposed on a side of the die plate opposite to the spring element sheet, the first press plate and the second press plate configured to remain without deformation when receiving pressure and transmitting pressure during formation of the three dimensional spring elements.

2. The system of claim 1, the die plate comprising:
   a second spacer layer, the second spacer layer containing a plurality of openings; and
   a plurality of configurable die, the configurable die being positioned in at least some of the plurality of openings in the second spacer layer and providing the three dimensional structures of the die plate.

3. The system of claim 1, the three dimensional structures forming in the spring element sheet finished spring elements extending above a planar surface portion of the spring element sheet.

4. The system of claim 2, the configurable die comprising ball bearings configured to press fit into openings in the second spacer layer and project above the planar surface of the die plate to a predetermined height based on a desired height of the formed three dimensional spring elements.

5. The system of claim 1, further comprising an alignment system including at least one dowel pin located on the second press plate and at least one alignment hole in the die plate, the spring element sheet, the first spacer layer, and the first press plate.

6. The system of claim 4, the first spacer layer comprising a first spacer sheet having a plurality of first spacer openings that are complementary to the ball bearings of the die plate.

7. The system of claim 1, the first spacer layer comprising an elastic material having a predetermined thickness and being substantially conformable to the three dimensional structures of the die plate.

8. The system of claim 7, the predetermined thickness being greater than a predetermined height of three dimensional features of the die plate.

9. The system of claim 2, the first spacer layer comprising a second die plate and having a second plurality of openings containing configurable die.

10. A method for batch forming a sheet of spring elements in three dimensions, comprising:
    defining a plurality of individual two dimensional spring elements in a spring sheet;
    providing a spacer layer to contact the spring sheet and patterning the spacer layer with a set of spacer layer holes;
    arranging a first set of die comprising a first set of die in a die plate to contact some of the individual two dimensional spring elements; and
    arranging the spacer layer on a side of the spring sheet opposite to the first set of die and aligning the spacer layer with the set of die such that positions of the set of spacer layer holes correspond to positions of the first set of die;
    after arranging the spacer layer, pressing the spring sheet against the first set of die to form the contacted two dimensional spring elements into three dimensional spring elements,
    the arranging of the first set of die to contact some of the individual two dimensional spring elements comprising:
    providing a first set of die plate holes arranged in a first pattern in the die plate;
    inserting the first set of die into at least some of the first set of die plate holes according to a second pattern; and
    aligning the spring sheet and die plate so that planar positions of the first set of die correspond to positions of the two dimensional spring elements; and
    placing a second set of die into at least some of the set of spacer layer holes, the second set of die arranged to contact the spring sheet at different planar locations than planar locations where the first set of die contact the spring sheet.

* * * * *